United States Patent
Watanabe

(10) Patent No.: US 7,012,238 B2
(45) Date of Patent: Mar. 14, 2006

(54) AMPLIFICATION-TYPE SOLID-STATE IMAGE PICKUP DEVICE INCORPORATING PLURALITY OF ARRAYED PIXELS WITH AMPLIFICATION FUNCTION

(75) Inventor: Takashi Watanabe, Kyoto-fu (JP)

(73) Assignee: Sharp Kabushiki Kaisha, Osaka (JP)

( * ) Notice: Subject to any disclaimer, the term of this patent is extended or adjusted under 35 U.S.C. 154(b) by 51 days.

(21) Appl. No.: 10/866,707

(22) Filed: Jun. 15, 2004

(65) Prior Publication Data
US 2005/0001148 A1    Jan. 6, 2005

(30) Foreign Application Priority Data

Jul. 2, 2003    (JP)    ............................ P2003-190171
Oct. 17, 2003   (JP)    ............................ P2003-357652

(51) Int. Cl.
H04N 5/335    (2006.01)

(52) U.S. Cl. ............................ 250/214 A; 250/208.1; 348/294; 348/308

(58) Field of Classification Search ............. 250/208.1, 250/214 R, 214 A; 348/243, 294, 300–302, 348/308, 311, 909
See application file for complete search history.

(56) References Cited

U.S. PATENT DOCUMENTS

| | | | |
|---|---|---|---|
| 6,519,371 B1 * | 2/2003 | Pain et al. | 382/288 |
| 2003/0141497 A1 * | 7/2003 | Watanabe | 257/21 |
| 2004/0174450 A1 * | 9/2004 | Lee et al. | 348/308 |
| 2004/0201550 A1 * | 10/2004 | Nakamura et al. | 345/55 |
| 2005/0083422 A1 * | 4/2005 | Lee et al. | 348/308 |

OTHER PUBLICATIONS

Analysis and enhancement of low-light level performance of photodiode-type CMOS active pixel imagers operated with sub-threshold reset by Bedabrata Pain et al. in IEEE Workshop on Charge-Couple Devices and Advanced image Sensors, Jun. 1999, p140-143.

* cited by examiner

Primary Examiner—Stephone B. Allen
(74) Attorney, Agent, or Firm—Nixon & Vanderhye, P.C.

(57) ABSTRACT

An amplification-type solid-state image pickup device of the present invention repeats, in every frame, a signal level readout period, a first reset period, a reset level readout period, a second reset period, and a third reset period in this order. In the first reset period and the third reset period, a MOS transistor for reset is set to execute a soft reset operation with a sub-threshold current, while in the second reset period, the MOS transistor for reset is set to execute a hard reset operation so as to fix the potential of a photon-electron conversion region to a drain potential. This makes it possible to reduce both reset noise and image retention with a simple constitution.

16 Claims, 13 Drawing Sheets

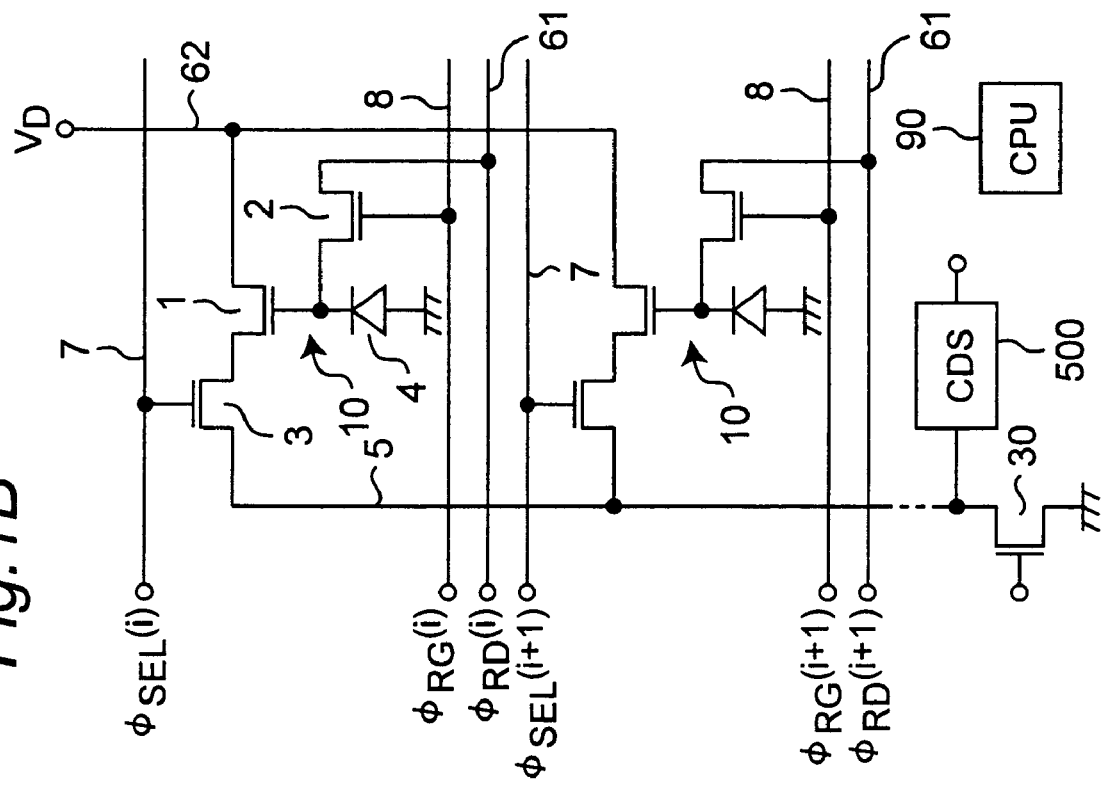
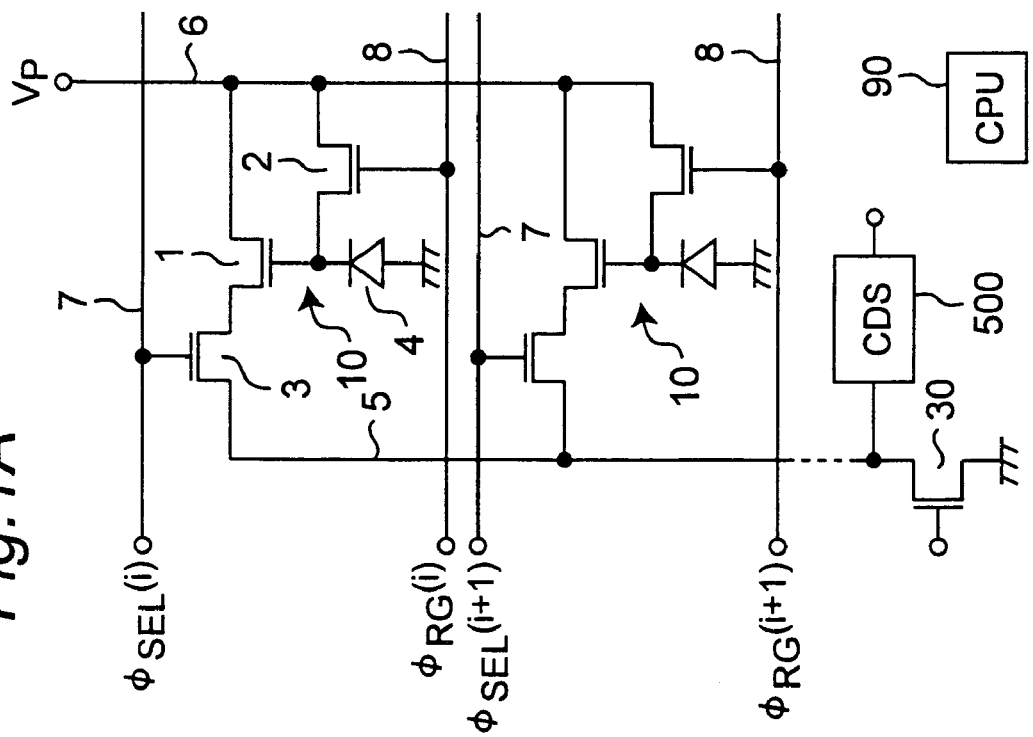

AMPLIFICATION-TYPE SOLID-STATE IMAGE PICKUP DEVICE INCORPORATING PLURALITY OF ARRAYED PIXELS WITH AMPLIFICATION FUNCTION

This Nonprovisional application claims priority under 35 U.S.C. §119(a) on Patent Application No. 2003-190171 filed in Japan on Jul. 2nd 2003 and Patent Application No. 2003-357652 filed in Japan on October 17th, the entire contents of which are hereby incorporated by reference.

BACKGROUND OF THE INVENTION

The present invention relates to an amplification-type solid-state image pickup device, and more specifically relates to an amplification-type solid-state image pickup device incorporating a plurality of arrayed pixels with an amplification function.

There has been proposed an amplification-type solid-state image pickup device having a pixel portion in which each pixel has an amplification function and a scanning circuit disposed around the pixel portion, the pixel portion being scanned by the scanning circuit so that each pixel data is read out. Particularly, there is known an APS (Active Pixel Sensor)-type image sensor having a pixel constitution composed of a CMOS that offers advantage in integrating the pixel constitution with peripheral driver circuit and signal processing circuit.

Generally, the APS-type image sensor is constituted such that a photon-electron conversion portion, an amplification portion, a pixel selection portion and a reset portion are provided in one pixel. The photon-electron conversion portion is typically formed from a photo diode (PD), while the amplification portion, the pixel selection portion and the reset portion are formed from three to four MOS-type transistors (Tr).

In FIG. 14, there is shown a constitution of an APS-type image sensor of a (PD+3Tr) type composed of one photodiode (PD) and three MOS transistors (Tr) (to simplify the drawing, the pixel portion shown therein is composed of only 2 rows and 2 columns (4 pixels)). In FIG. 14, there are shown an amplification MOS transistor 201, a reset MOS transistor 202, a pixel selection MOS transistor 203, a photon-electron conversion photodiode 204, a signal line 205, a power line 206, a pixel selection line 207 and a reset gate line 280. The MOS transistors 203 and 202 are respectively driven by a vertical scanning circuit (I) 221 and a vertical scanning circuit (IIo) 222 through the pixel selection line 207 and the reset gate line 280. The signal line 205 is connected to the MOS transistor 230 that supplies a constant-current load (a voltage of $V_{L1}$ is applied as a gate bias voltage), and the output voltage is sent to a horizontal signal line 236 through an amplifier (amplification-type MOS transistor) 231 and a MOS transistor 232. The MOS transistor 232 is driven by a horizontal scanning circuit 234 through a horizontal clock line 235. The horizontal signal line 236 is connected to a MOS transistor 233 that supplies a constant-current load (a voltage of $V_{L2}$ is applied as a gate bias voltage), and the output voltage is lead to an output OS through an amplifier 237.

As shown in FIG. 15 with the above-described pixel constitution, if $V_{DD}<\phi_{RH}$ where a channel potential below the reset gate is set to $\phi_{RH}$ and a reset drain voltage is set to $V_{DD}$ when a gate (reset gate) of the reset transistor 202 is in ON state, then a voltage of the photodiode 204 is reset to $V_{DD}$ when the reset gate is in ON state. However, after the reset gate is turned off, the photodiode suffers from noise $\Delta$Nrn expressed in electron number as shown in the following equation (1).

$$\Delta Nrn = (kTCp)^{1/2}/q \quad (1)$$

wherein k represents a Boltzman's constant, T represents an absolute temperature, Cp represents the capacity of the photodiode and a region connected thereto, and q represents an elementary charge. As is clear from the equation (1), the reset noise is dependent on the capacity Cp and rises as Cp increases.

As is clear from FIG. 14, Cp includes not only the capacity of the photodiode itself but also the gate capacity of the amplification MOS transistor 201 and their reciprocal connection capacity. Because of this, the above-constituted pixel requires reduction in the reset noise $\Delta$Nrn.

In order to reduce the reset noise, a soft reset operation as described below has been proposed (see, e.g., "Analysis and enhancement of low-light level performance of photodiode-type CMOS active pixel imagers operated with sub-threshold reset" by Bedabrata Pain et al. in IEEE Workshop on Charge-Coupled Devices and Advanced Image Sensors, June 1999, p140–143). More specifically, as shown in FIG. 16, if $V_{DD}>\phi_{RH}$ when the gate (reset gate) of the reset transistor 202 is in ON state, then the potential of the photodiode 204 is reset to a sub-threshold region in the vicinity of $\phi_{RH}$. In this case, after the reset gate is turned off, the photodiode suffers from noise $\Delta$Nrn expressed in electron number as shown in the following equation (2).

$$\Delta Nrn = (kTCp/2)^{1/2}/q \quad (2)$$

In this case, the noise expressed in electron number is reduced to $(1/2)^{1/2}=0.71$ of the noise in the equation (1).

However, if the potential of the reset drain 206 is fixed to $V_{DD}$ by the soft reset operation, leakage in the reset gate due to sub-threshold current disables the potential of the photodiode from being fixed, substantially causing image retention for as a very long period of time as not less than 10 frames.

In order to avoid the phenomenon of image retention, a method of performing a hard reset operation before the soft reset operation has been proposed. FIG. 17 shows its circuit constitution, and FIG. 18 shows its operation timing. In this method, before the soft reset operation, the reset drain potential is once set to a potential $(V_{DD}-\Delta\phi_m)$ lower than $\phi_{RH}$. This fixes the potential of the photodiode to $(V_{DD}-\Delta\phi_m)$ so that the potential of the photodiode displaced by the leakage due to the sub-threshold current is fixed with respect to each storage period, thereby preventing the image retention from occurring.

As shown in FIG. 17, the circuit constitution in this case is different from the circuit constitution shown in FIG. 14 in the point that not a DC (Direct Current) but a pulsed potential VP(i) is applied to a power line 310. More specifically, the potential VP(i) is changed between two values by transistors 311, 312 and the pulse VPo(i). That is, when VPo(i) is in low level, the transistor 311 is turned on to make VP(i)=$V_{DD}$. When VPo(i) is in high level, the transistor 311 is turned off, and applied to the power line 310 is a voltage decreased from $V_{DD}$ by a potential drop portion $\Delta\phi_m$ of the transistor 312 as shown below.

$$VP(i)=V_{DD}-\Delta\phi_m$$

As shown in FIG. 18, a reset period (T11+T12) is set when RS(i) becomes high level. In the former half period T11, VP(i)=$V_{DD}-\Delta\phi_m$, so that setting $V_{DD}-\Delta\phi_m<\phi_{RH}$ fixes the potential of the photodiode to $(V_{DD}-\Delta\phi_m)$. This means that the hard reset operation is performed. Next, in the latter half period T12, VP(i)=$V_{DD}$, so that setting $V_{DD}$>$\phi_{RH}$ allows the soft reset operation of the photodiode. Herein, signal level read is executed before the reset period (T11+T12), while reset level read is executed after the reset period (T11+T12).

However, although in the method of executing the hard reset operation before the soft reset operation described with reference to FIGS. 17 and 18, image retention can be avoided, the reset noise is, as shown in the equation (2), at best reduced to 0.71 times the level of the noise in electron number generated in the typical reset operation, which is the noise level insufficient for high-resolution image sensors.

SUMMARY OF THE INVENTION

Accordingly, an object of the present invention is to provide an amplification-type solid-state image pickup device capable of reducing both reset noise and image retention with a simple constitution.

Another object of the present invention is to provide an amplification-type solid-state image pickup device capable of reducing both reset noise and image retention with a simple constitution as well as retaining linearity of output signals against incident optical signals.

In order to accomplish the above objects, an amplification-type solid-state image pickup device in the present invention comprises:

a plurality of arrayed pixels, each of the pixels being composed of at least a photon-electron conversion region, a field effect transistor for signal amplification for amplifying signals expressed by potentials of the photon-electron conversion region, a field effect transistor for reset for discharging charges in the photon-electron conversion region to a drain, and a field effect transistor for pixel selection; and a control portion for executing control so that with respect to each frame in each of the pixels, there are repeated in the following order a signal level readout period in which a potential level of the photon-electron conversion region is read through the field effect transistor for signal amplification, a first reset period in which the field effect transistor for reset executes a soft reset operation with a sub-threshold current, a reset level readout period in which a potential level of the photon-electron conversion region reached by the soft reset operation in the first reset period is read through the field effect transistor for signal amplification, a second reset period in which the field effect transistor for reset executes a hard reset operation so as to fix the potential of the photon-electron conversion region to a drain potential, and a third reset period in which the field effect transistor for reset executes a soft reset operation with a sub-threshold current.

The term "frame" herein refers to a fundamental period of a cyclic operation of the solid-state image pickup device, and in the case of two-dimensional image sensors, it is equivalent to a period for scanning one screen.

In the amplification-type solid-state image pickup device of the present invention, a reset operation which is executed at the end in a preceding frame (a frame immediately before a noticed frame) is a soft reset operation in the third reset period. Therefore, in the signal level readout period in the noticed frame (indicating the frame that is noticed), the potential level obtained by charges stored in the photon-electron conversion region is read out after the soft reset operation is executed in the preceding frame (a signal read out at this point is referred to as a "read out signal level").

Next, in the first reset period, the field effect transistor for reset is set to execute a soft reset operation with a sub-threshold current.

Next, in the reset level readout period, the potential level of the photon-electron conversion region reached by the soft reset operation in the first reset period is read out through the field effect transistor for signal amplification (a signal read out at this point is referred to as a "readout reset level"). In the soft reset operation, due to memory effect, a correlation is developed between reset noise after the last soft reset operation in the preceding frame and reset noise after the first soft reset operation in the noticed frame. Accordingly, performing Correlated Double Sampling (CDS) between, for example, the readout signal level and readout reset level leads to reduction in reset noise.

Next, in the second reset period, the field effect transistor for reset is set to execute a hard reset operation so as to fix the potential of the photon-electron conversion region to a drain potential. Since the potential of the photodiode in the photon-electron conversion region is fixed to a drain potential, the problem of the image retention can be solved in this stage.

After this, in the third reset period, the field effect transistor for reset is set to execute a soft reset operation with a sub-threshold current. The charges stored in the photon-electron conversion region after execution of the soft reset operation are read out in a succeeding frame (indicating a frame immediately after the noticed frame).

In such a case, the problem of the image retention has already been solved in the second reset period, and therefore image retention is confined to one frame. Therefore, the image retention is decreased and becomes substantially negligible.

Further, the present invention is characterized in that the control portion executes control so that the signal level readout period, the first reset period, the reset level readout period, the second reset period and the third reset period are repeated in this order. Such control can be easily implemented by, for example, a CPU (Central Processing Unit). Therefore, the amplification-type solid-state image pickup device of the present invention is easily constituted without the necessity of using specific component parts or the like.

Thus, according to the amplification-type solid-state image pickup device of the present invention, both the reset noise and the image retention can be reduced with a simple constitution.

It is to be noted that in the first reset period and the third reset period, in order to set, for example, an N channel-type field effect transistor for reset to execute a soft reset operation, it is preferable that the gate potential of the field effect transistor for reset be high, the drain potential be high, and the channel potential in the field effect transistor for reset when the gate is in high potential state be lower than the drain potential when the drain potential is in high level.

Further, in the second reset period, in order to set, for example, an N channel-type field effect transistor for reset to execute a hard reset operation, it is preferable that the drain potential of the field effect transistor for reset become low level while the gate potential stays high, and the channel potential in the field effect transistor for reset when the gate potential is in high level be higher than the drain potential when the drain potential is in low level.

Further, in the reset level readout period, it is preferable that the drain potential of, for example, an N channel-type field effect transistor for reset be in high state and the gate potential of the field effect transistor for reset be in low state.

Further, in the case where the gate potential of the N channel-type field effect transistor for reset has two high states of a first high state and a second high state, it is preferably that the gate potential is set to the first high state in the first reset period and set to the second high state in the second reset period and the third reset period.

An amplification-type solid-state image pickup device in one embodiment further comprises a correlated double sampling portion for performing a correlated double sampling operation on between a signal read out in the signal level readout period and a signal read out in the reset level readout period.

In the amplification-type solid-state image pickup device in this one embodiment, a correlated double sampling portion performs the correlated double sampling operation on between a signal read out in the signal level readout period (readout signal level) and a signal read out in the reset level readout period (readout reset level) This allows further reduction in reset noise.

In an amplification-type solid-state image pickup device of one embodiment, a plurality of the pixels are arrayed in matrix form, gates of the field effect transistors for reset are each connected on a row basis to reset gate lines extending in row direction, and there is provided a first scanning circuit for sequentially applying two pulsed driving voltages to the gates of the field effect transistors for reset on a row basis through the reset gate lines.

According to the amplification-type solid-state image pickup device in this one embodiment, the gate potentials of the field effect transistors for reset can be controlled on a row basis by the first scanning circuit.

In an amplification-type solid-state image pickup device in one embodiment, one terminals of the field effect transistors for pixel selection are each connected on a column basis to signal lines extending in column direction, gates of the field effect transistors for pixel selection are each connected on a row basis to pixel selection lines extending in row direction, and there is provided a second scanning circuit for sequentially applying two pulsed driving voltages to the gates of the field effect transistors for pixel selection on a row basis through the pixel selection lines.

In the amplification-type solid-state image pickup device in this one embodiment, the gate potentials of the field effect transistors for pixel selection are controlled on a row basis by the second scanning circuit. Signals from selected pixels are outputted through the signal lines.

In an amplification-type solid-state image pickup device in one embodiment, drains of the field effect transistors for reset are each connected on a column basis to drain lines extending in column direction, and there is provided a voltage application portion for applying two pulsed driving voltages to the drains of the field effect transistors for reset through the drain lines.

In the amplification-type solid-state image pickup device in this one embodiment, the drain potentials of the field effect transistors for reset are controlled by the voltage application portion.

In an amplification-type solid-state image pickup device in one embodiment, drains of the field effect transistors for amplification are each connected on a column basis to the drain lines.

In the amplification-type solid-state image pickup device in this one embodiment, the drain potentials of the field effect transistors for amplification are controlled by the voltage application portion.

In an amplification-type solid-state image pickup device in one embodiment, drains of the field effect transistors for reset are each connected on a row basis to reset drain lines extending in row direction, and there is provided a third scanning circuit for sequentially applying two pulsed driving voltages to the drains of the field effect transistors for reset on a row basis through the reset drain lines.

In the amplification-type solid-state image pickup device in this one embodiment, the drain potentials of the field effect transistors for reset are controlled on a row basis by the third scanning circuit.

An amplification-type solid-state image pickup device in one embodiment further comprises a voltage setting portion for setting voltages V1, V2 and V4 so as to satisfy a relation $$|V1-Vt| \geq |V2-Vt| > |V4-Vt| \qquad (3)$$

wherein V1 denotes a gate voltage of the field effect transistor for reset in the first reset period, V2 denotes a gate voltage of the field effect transistor for reset in the second reset period and the third reset period, V4 denotes a gate voltage of the field effect transistor for reset in periods other than the first and second reset periods, and Vt denotes a threshold gate voltage of the field effect transistor for reset.

The symbol |a| in the equation (3) refers to an absolute value of a.

Further, since Vt is contained in the equation (3), the present invention can be specified even if the field effect transistor for reset is either P channel-type or N channel-type.

In the amplification-type solid-state image pickup device in this one embodiment, the reset operation executed at the end in the preceding frame is a soft reset operation in the third reset period. Since the soft reset operation is executed in succession to the hard reset operation, a potential of the photon-electron conversion region reached by the soft reset operation always stays constant regardless of the intensity of incident light.

After lapse of a period for storing charges in a photon-electron conversion region (this period refers to "optical signal storage period") in succession to the third reset period in the preceding frame, a potential level (readout signal level) obtained by the charges stored in the photon-electron conversion region is read out in the signal level readout period in a noticed frame.

Next, in the first reset period, the field effect transistor for reset is set to execute a soft reset operation with a sub-threshold current. With the relation of $|V1-Vt| \geq |V2-Vt|$ in effect, the potential of the photon-electron conversion region reached by the soft reset operation stays constant regardless of the intensity of incident light (i.e., a charge amount stored in the photon-electron conversion region during the optical signal storage period) as with the case of executing the soft reset operation in succession to the hard reset operation.

Next, in the reset level readout period, the potential level (readout reset level) of the photon-electron conversion region reached by the soft reset operation in the first reset period is read out through the field effect transistor for signal amplification. In the soft reset operation, due to memory effect, a correlation is developed between reset noise after the last soft reset operation in the preceding frame and reset noise after the first soft reset operation in the noticed frame. Accordingly, performing Correlated Double Sampling (CDS) between, for example, the readout signal level and readout reset level leads to reduction in reset noise.

Furthermore, as described before, both the potential of the photon-electron conversion region reached by the soft reset operation in the third reset period in the preceding frame and the potential (readout reset level) of the photon-electron conversion region reached by the soft reset operation in the first reset period in the noticed frame stay constant regardless of the intensity of incident light (i.e., a charge amount stored in the photon-electron conversion region during the optical signal storage period). Therefore, a pixel output signal expressed by a difference between the readout signal level and the readout reset level can be linearly changed with respect to the intensity of incident light.

Next, in the second reset period, the field effect transistor for reset is set to execute a hard reset operation so as to fix the potential of the photon-electron conversion region to a drain potential. Since the potential in the photon-electron conversion region is fixed to a drain potential, the problem of the image retention can be solved in this stage.

After this, in the third reset period, the field effect transistor for reset is set to execute a soft reset operation with a sub-threshold current. The charges stored in the photon-electron conversion region after execution of the soft reset operation are read out in a succeeding frame (indicating a frame immediately after the noticed frame).

In such a case, the problem of the image retention has already been solved in the second reset period, and therefore image retention is confined to one frame. Therefore, the image retention is decreased and becomes substantially negligible.

Further, this one embodiment is characterized in that the control portion executes control so that the signal level readout period, the first reset period, the reset level readout period, the second reset period and the third reset period are repeated in this order while the relation of $|V1-Vt| \geq |V2-Vt| > |V4-Vt|$ is maintained by the voltage setting portion. Such control can be easily implemented by, for example, a CPU (Central Processing Unit). Therefore, the amplification-type solid-state image pickup device of the present invention is easily constituted without the necessity of using specific component parts or the like.

Thus, according to the amplification-type solid-state image pickup device in this one embodiment, both the reset noise and the image retention can be reduced with a simple constitution, and a pixel output signal can be linearly changed with respect to the intensity of incident light.

In an amplification-type solid-state image pickup device in one embodiment, the voltage setting portion sets a value of $|V1-V2|$ to be larger than a specified value so that a potential of the photon-electron conversion region immediately after the first reset period stays constant regardless of intensity of incident light to the photon-electron conversion region.

The term "specified value" herein refers to a difference $\Delta V1$ between a channel potential and a potential of the photon-electron conversion region reached in the third reset period (when the reset gate potential is V2).

In the amplification-type solid-state image pickup device in this one embodiment, both the potential of the photon-electron conversion region reached by the third soft reset operation in the preceding frame and the potential (readout reset level) of the photon-electron conversion region reached by the first reset operation in the noticed frame securely stay constant regardless of the intensity of incident light (i.e., a charge amount stored in the photon-electron conversion region during the optical signal storage period). Therefore, a pixel output signal expressed by a difference between the readout signal level and the readout reset level can be linearly changed with respect to the intensity of incident light.

In an amplification-type solid-state image pickup device in one embodiment, the voltage setting portion sets a value of $|V2-V4|$ within a specified range so that potential change of the photon-electron conversion region with respect to intensity of incident light is linear if the intensity of incident light is low whereas the potential change is logarithmic if the intensity of incident light is high.

If the value of $|V2-V4|$ is sufficiently large, then signal charges that are photon-electron converted during the optical signal storage period are linearly stored in the photon-electron conversion region. More precisely, the amplification-type solid-state image pickup device exhibits a linear photon-electron conversion characteristic substantially in the entire region of the incident light intensity. If the value of $|V2-V4|$ is sufficiently small, then a sub-threshold operation is taken place and the potential of the photon-electron conversion region is logarithmically changed with respect to the intensity of incident light. More precisely, the amplification-type solid-state image pickup device exhibits a logarithmic photon-electron conversion characteristic substantially in the entire region of the incident light intensity. Within the range of the value of $|V2-V4|$, a sub-threshold operation is taken place in a region high in the intensity of incident light and the logarithmic photon-electron conversion characteristic is exhibited, whereas in the region low in the intensity of incident light, the linear photon-electron conversion characteristic is exhibited. Accordingly, in the amplification-type solid-state image pickup device in one embodiment, as described above, the value of $|V1-V2|$ is set within a specified range by the voltage setting portion so that potential change of the photon-electron conversion region with respect to intensity of incident light is linear if the intensity of incident light is low whereas the potential change is logarithmic if the intensity of incident light is high. This allows application of the amplification-type solid-state image pickup device either to logarithmic conversion-type image sensors and linear conversion-type image sensors.

An amplification-type solid-state image pickup device in one embodiment further comprises a correlated double sampling portion for performing a correlated double sampling operation on between a signal read out in the signal level readout period and a signal read out in the reset level readout period.

In the amplification-type solid-state image pickup device in this one embodiment, the correlated double sampling portion performs a correlated double sampling operation on between a signal read out in the signal level readout period (readout signal level) and a signal read out in the reset level readout period (readout reset level) This allows further reduction in reset noise.

In an amplification-type solid-state image pickup in one embodiment, a plurality of the pixels are arrayed in matrix form, gates of the field effect transistors for reset are each connected on a row basis to reset gate lines extending in row direction, and the voltage setting portion includes a first scanning circuit for sequentially applying three pulsed driving voltages that are said V1, V2 and V4 to the gates of the field effect transistors for reset on a row basis through the reset gate lines.

According to the amplification-type solid-state image pickup device in this one embodiment, the gate potentials of the field effect transistors for reset can be controlled on a row basis by the first scanning circuit.

In an amplification-type solid-state image pickup device in one embodiment, one terminals of the field effect transistors for pixel selection are each connected on a column basis to signal lines extending in column direction, gates of the field effect transistors for pixel selection are each connected on a row basis to pixel selection lines extending in row direction, and there is provided a second scanning circuit for sequentially applying two pulsed driving voltages to the gates of the field effect transistors for pixel selection on a row basis through the pixel selection lines.

In the amplification-type solid-state image pickup device in this one embodiment, the gate potentials of the field effect transistors for pixel selection are controlled on a row basis by the second scanning circuit. Signals from selected pixels are outputted through the signal lines.

In an amplification-type solid-state image pickup device in one embodiment, drains of the field effect transistors for reset are each connected on a column basis to drain lines extending in column direction, and there is provided a voltage application portion for applying two pulsed driving voltages to the drains of the field effect transistors for reset through the drain lines.

In the amplification-type solid-state image pickup device in this one embodiment, the drain voltages of the field effect transistor for reset are controlled by the voltage application portion.

In an amplification-type solid-state image pickup device in one embodiment, drains of the field effect transistors for amplification are each connected on a column basis to the drain lines.

In the amplification-type solid-state image pickup device in this one embodiment, the drain potentials of the field effect transistor for amplification are controlled by the voltage application portion.

In an amplification-type solid-state image pickup device in one embodiment, drains of the field effect transistors for reset are each connected on a row basis to reset drain lines extending in row direction, and there is provided a third scanning circuit for sequentially applying two pulsed driving voltages to the drains of the field effect transistors for reset on a row basis through the reset drain lines.

In the amplification-type solid-state image pickup device in this one embodiment, the drain potentials of the field effect transistors for reset are controlled on a row basis by the third scanning circuit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A is a view exemplifying the circuit constitution of a two-dimensional image sensor;

FIG. 1B is a view showing an modified example of the image sensor shown in FIG. 1A;

DETAILED DESCRIPTION OF THE PREFERRED EMBODIMENTS

The amplification-type solid-state image pickup device of the present invention will be described hereinbelow in detail in conjunction with the embodiment with reference to the drawings.

Although description will be given of the case where an N channel-type transistor (threshold gate voltage Vt=0 for simplification) is adopted below, the present invention is not limited to this, and therefore the same discussion is applicable to the case where a P channel-type transistor is adopted by reversing voltage polarity.

(First Embodiment)

FIG. 1A shows the circuit constitution of an APS (Active Pixel Sensor)-type two-dimensional image sensor in one embodiment of the present invention. Although the image sensor incorporates a plurality of pixels disposed in matrix form, only two pixels 10 of two rows by one column are shown for easier understanding. Row direction corresponds to horizontal direction while column direction corresponds to vertical direction.

Figure 2:
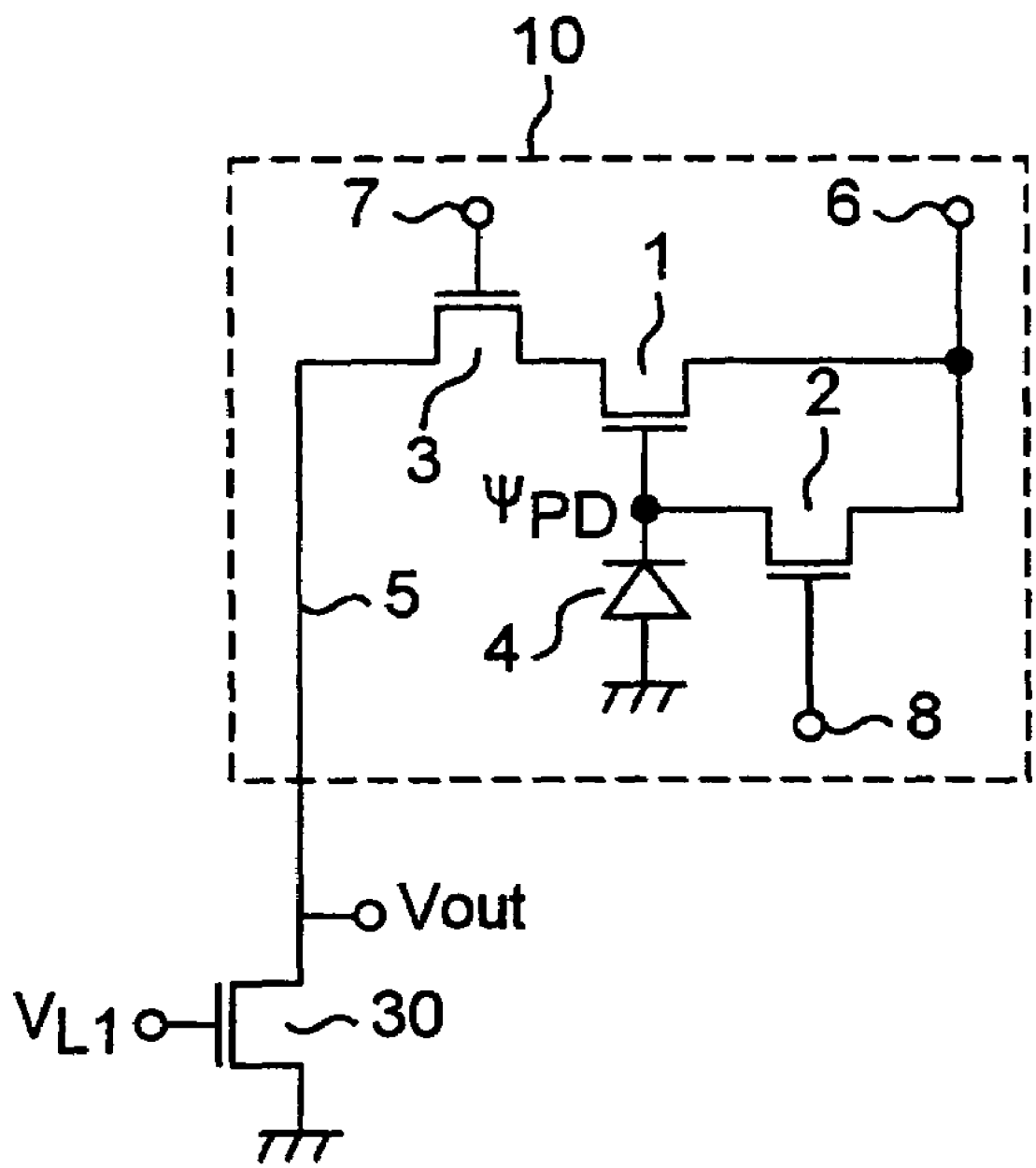
FIG. 2 is a view showing a circuit constitution of a pixel in an APS-type image sensor in one embodiment of the present invention.

As shown in FIG. 2, each pixel 10 is composed of one photodiode (PD) 4 serving as a photon-electron conversion region, and three N channel-type MOS transistors (Tr) 1, 2, 3 (PD+3Tr type), more specifically, a MOS transistor for signal amplification 1, a MOS transistor for reset 2, and a MOS transistor for pixel selection 3.

The anode of the photodiode 4 is grounded and the cathode is connected to the MOS transistor for signal amplification 1. The MOS transistor for signal amplification 1 amplifies a signal representing a potential of the photodiode 4 (cathode potential, same in the following description). The MOS transistor for pixel selection 3 is disposed in between the MOS transistor for signal amplification 1 and a signal line 5 and serves for selection of the pixel. The MOS transistor for reset 2 is disposed in between the cathode of the photodiode 4 and a drain line 6, and serves for discharging charges of the photodiode 4 (charges in a cathode region, i.e., electrons, same in the following description) to a drain.

As shown in FIG. 1A, gates of the MOS transistors for reset 2 are each connected on a row basis to reset gate lines 8 extending in row direction. Two pulsed driving voltages $\phi_{RG}$ are sequentially applied to the gates of the MOS transistors for reset 2 on a row basis through the reset gate lines 8 by an unshown first scanning circuit. This enables gate potentials of the MOS transistors for reset 2 to be controlled on a row basis. It is to be noted that reference numeral (i), (i+1), . . . denote row numbers. The drains of the MOS transistors for reset 2 are each connected on a column basis to a drain line 6 extending in column direction. Two pulsed driving voltages $V_p$ (that is a signal $\phi_{RD}$ shown in later described FIG. 3) are applied to the drains of the MOS transistors for reset 2 through the drain line 6 by an unshown voltage application portion. This enables the drain potentials of the MOS transistors for reset 2 to be controlled.

Moreover in this example, the drains of the MOS transistors for amplification 1 are also each connected on a column basis to the drain line 6 and share the drain line 6 with the MOS transistors for reset 2 (or it is also acceptable that the drain line 6 is not shared as described later). This enables the drain potentials of the MOS transistors for amplification 1 to be controlled by the driving voltage $V_p$.

Further, the gates of the MOS transistors for pixel selection 3 are each connected on a row basis to pixel selection lines 7 extending in row direction. Two pulsed driving voltages $\phi_{SEL}$ are sequentially applied to the gates of the MOS transistors for pixel selection 3 on a row basis through the pixel selection lines 7 by an unshown second scanning circuit. This enables gate potentials of the MOS transistors for pixel selection 3 to be controlled on a row basis. One terminals of the MOS transistors for pixel selection 3 (the terminals opposite to the MOS transistors for signal amplification 1) are each connected on a column basis to vertical signal lines 5 extending in column direction. A signal from a selected pixel is outputted through the vertical signal line 5.

The vertical signal line 5 is connected to a MOS transistor 30 that supplies a constant-current load (a voltage of $V_{L1}$ is applied as a gate bias voltage as shown in FIG. 2).

A signal Vout outputted through the vertical signal line 5 is led to a correlated double sampling circuit 500. The correlated double sampling circuit 500 obtains a difference between a later-described readout signal level and readout reset level.

The overall operation of the two-dimensional image sensor is controlled by a CPU (Central Processing Unit) 90 serving as a control portion. In the case of a two-dimensional matrix disposition, the operation is typically performed on a row basis in one horizontal scanning period after another, and therefore if pixels are treated collectively, the operation is performed on the basis of one horizontal scanning period. However, in the view from a specified pixel, the operation is always performed per frame.

Figure 3:
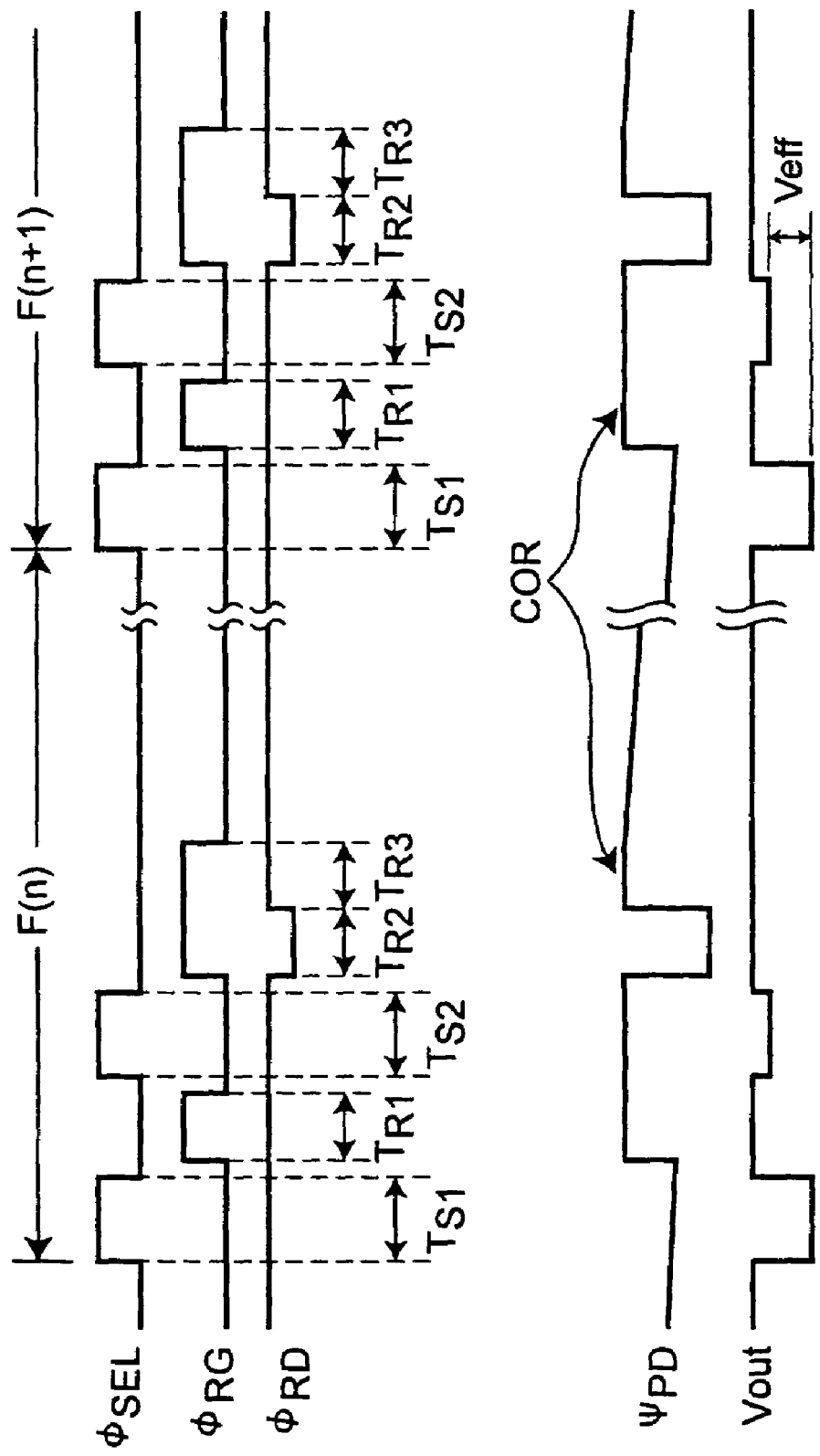
FIG. 3 is a view showing operation timing of a given pixel in the image sensor.

FIG. 3 shows operation timing of a given pixel by the control of the CPU 90. Herein, $\phi_{SEL}$ denotes a signal applied to the pixel selection line 7, $\phi_{RG}$ denotes a signal applied to the reset gate line 8, $\phi_{RD}$ denotes a signal applied to the drain line 6, $\psi_{PD}$ denotes a potential of the photodiode 4, and Vout denotes a potential of the vertical signal line 5. A period for scanning one screen is expressed as a frame F. It is to be noted that reference numeral (n), (n+1), . . . represent frame numbers, and a preceding frame (indicating a frame immediately before a noticed frame) is referred to as F(n) and the noticed frame (indicating the frame that is noticed) as F(n+1).

The two-dimensional image sensor repeats, in every frame F, a signal level readout period $T_{S1}$, a first reset period $T_{R1}$, a reset level readout period $T_{S2}$, a second reset period $T_{R2}$, and a third reset period $T_{R3}$ in this order. In the first reset period $T_{R1}$ and the third reset period $T_{R3}$, the MOS transistor for reset 2 is set to execute a soft reset operation, while in the second reset period $T_{R2}$, the MOS transistor for reset 2 is set to execute a hard reset operation (as for bias setting, description will be given later).

Hereinbelow, description will be given focusing on the frame F(n+1).

i) First, in the signal level readout period $T_{S1}$, a signal $\phi_{SEL}$ becomes high and the MOS transistor for pixel selection 3 is turned on. As a consequence, a potential level of the photodiode 4 is read out as a signal Vout to the signal line 5 through the MOS transistor for signal amplification 1 and the MOS transistor for pixel selection 3.

Herein, the reset operation executed at the end in the preceding frame F(n) is a soft reset operation in the third reset period $T_{R3}$. Therefore, in the signal level readout period $T_{S1}$ of the noticed frame F(n+1), read out is a potential level reached by charges stored in the photodiode 4 after the soft reset operation executed in the preceding frame F(n) (a signal read out at this point is referred to as a "readout signal level").

ii) Next, in the first reset period $T_{R1}$, the signal $\phi_{SEL}$ becomes low and the MOS transistor for pixel selection 3 is turned off. Then, the MOS transistor for reset 2 is set to execute a soft reset operation with a sub-threshold current.

iii) Next, in the reset level readout period $T_{S2}$, the signal $\phi_{SEL}$ becomes high and the MOS transistor for pixel selection 3 is turned on. As a consequence, a potential level of the photodiode 4 is read out as a signal Vout to the signal line 5 through the MOS transistor for signal amplification 1 and the MOS transistor for pixel selection 3.

Herein, the potential level of the photodiode 4 is increased by the soft reset operation in the first reset period $T_{R1}$ from the potential level after the signal level readout period $T_{S1}$. Therefore, the increased potential level of the photodiode 4 is read out (a signal read out at this point is referred to as a "readout reset level"). In the soft reset operation, due to memory effect, a correlation is developed between reset noise after the last soft reset operation in the preceding frame F(n) and reset noise after the first soft reset operation in the noticed frame F(n+1). Accordingly, if Correlated Double Sampling (CDS) operation is performed to obtain a difference Veff between the readout signal level and the readout reset level, the reset noise is drastically reduced.

iv) Next, in the second reset period $T_{R2}$, the signal $\phi_{SEL}$ becomes low and the MOS transistor for pixel selection 3 is turned off. Then, the MOS transistor for reset 2 is set to execute a hard reset operation so as to fix the potential of the photodiode 4 to a drain potential. Since the potential in the photodiode 4 is fixed to a drain potential, the problem of the image retention can be solved in this stage.

v) After that, in the third reset period $T_{R3}$, the MOS transistor for reset 2 is set to execute a soft reset operation with a sub-threshold current. The charges stored in the photodiode 4 after execution of the soft rest operation is further read out in a frame immediately after the frame F(n+1).

In such a case, the problem of the image retention has already been solved in the second reset period $T_{R2}$, and therefore image retention is confined to one frame. Therefore, the image retention is decreased and becomes substantially negligible.

Further, such control as repeating, in every frame F, the signal level readout period $T_{S1}$, the first reset period $T_{R1}$, the reset level readout period $T_{S2}$, the second reset period $T_{R2}$, and the third reset period $T_{R3}$ in this order can be easily implemented by the CPU 90. Therefore, the two-dimensional image sensor is easily constituted without the necessity of using specific component parts or the like.

In first reset period $T_{R1}$ and the third reset period $T_{R3}$, in order to set an N channel-type MOS transistor for reset 2 to execute a soft reset operation, it is preferable that the gate potential of the MOS transistor for reset be high, the drain potential be high, and the channel potential $\psi_{RG}$ (H) in the MOS transistor for reset 2 when the gate is in high potential state be lower than the drain potential $\psi_{RD}$ (H) when the drain line 6 is in high level. It is to be noted that reference numeral (L) denotes a low level while (H) denotes a high level (same in the following description).

Further, in the reset level readout period $T_{S2}$, in order to set an N channel-type MOS transistor for reset to execute a hard reset operation, it is preferable that the drain potential of the MOS transistor for reset become low level while the gate potential stay high, and channel potential $\psi_{RG}$ (H) in the MOS transistor for reset when the gate potential is in high level be higher than the drain potential $\psi_{RD}$ (L) when the drain line 6 is in low level.

More specifically, the relation of the following equation (4) should be satisfied.

$$\psi_{RD}(L) < \psi_{RG}(H) < \psi_{RD}(H) \quad (4)$$

Further, in the reset level readout period $T_{S2}$, it is preferable that the drain potential of the N channel-type MOS transistor for reset 2 be in high state and the gate potential of the MOS transistor for reset 2 be in low state.

Figure 4:
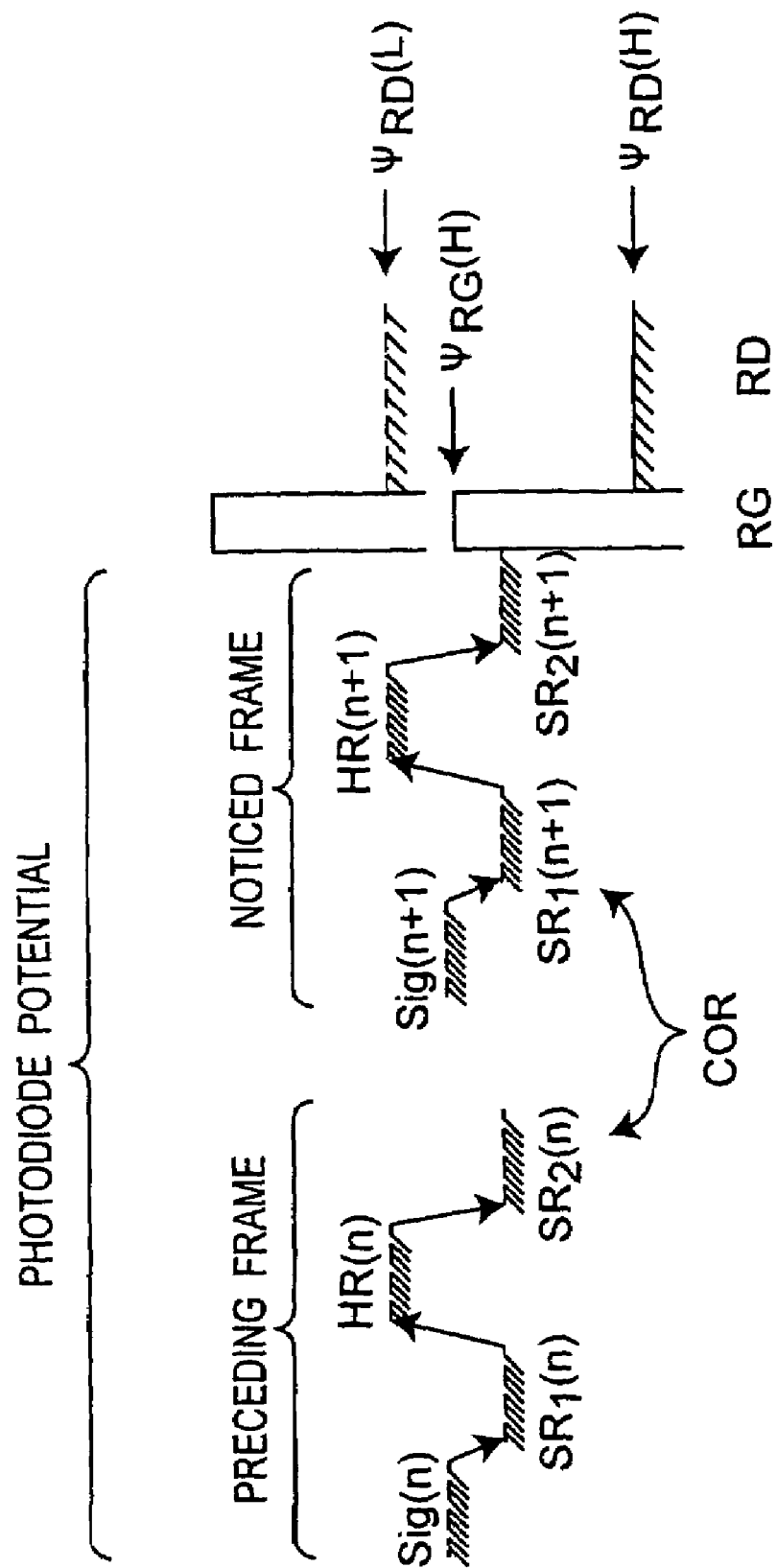
FIG. 4 is a schematic view showing change in potential of the photodiode in a pixel in conformity to the operation shown in FIG. 3.

FIG. 4 is a schematic view showing change in potential of the photodiode 4 in a pixel in conformity to the operation shown in FIG. 3. It is to be noted that in FIG. 4, the potential is higher toward downside.

As shown in the drawing, the potential of the photodiode 4 in the last soft reset operation (third reset period $T_{R3}$) in the preceding frame F(n) is set to a level $SR_2(n)$. By the charges stored according to optical input, the potential of the photodiode 4 becomes a level Sig(n+1) during signal readout (signal level readout period $T_{S1}$) in the noticed frame F(n+1). During the first soft reset operation (first reset period $T_{R1}$) after that, the potential of the photodiode 4 becomes $SR_1(n+1)$. Since a noise correlation is present between $SR_1(n)$ and $SR_1(n+1)$, reset noise can be drastically reduced if a difference is obtained as shown below:

$$Sig(n+1) - SR_1(n+1)$$

After that, during hard reset operation (second reset period $T_{R2}$), the potential of the photodiode 4 becomes HR(n+1), and image retention for one frame is deleted and is not carried over to the succeeding frames. More precisely, image retention is confined to one frame. During the last soft reset operation (third reset period $T_{R3}$), the potential of the photodiode 4 becomes $SR_2(n+1)$. This is a reset operation for the succeeding frame.

Although in the above example, the drains of the MOS transistors for amplification 1 and the drains of the MOS transistors for reset 2 are each connected on a column basis to a shared drain line 6, the present invention is not limited thereto and therefore individual lines may be provided as shown in FIG. 1B. In the example of FIG. 1B, the drains of the MOS transistors for reset 2 are each connected on a row basis to reset drain lines 61 extending in row direction. Two pulsed driving voltages $\phi_{RD}$ are sequentially applied to the drains of the MOS transistors for reset 2 on a row basis through the reset drain lines 61 by an unshown third scanning circuit. This enables drain potentials of the MOS transistors for reset 2 to be controlled on a row basis. The drains of the MOS transistors for amplification 1 are each connected on a column basis to a drain line 62 extending in column direction. A DC voltage $V_D$ is applied to the drain of the MOS transistor for amplification 1 through the drain line 62. The circuit of FIG. 1B operates similarly to the circuit described with reference to FIGS. 3 and 4 except that the drain voltage of the MOS transistor for amplification 1 is fixed to $V_D$.

Further, it should naturally be understood that field effect transistors other than the N channel-type MOS transistor can also be used as the transistors 1, 2 and 3.

(Second Embodiment)

In the aforementioned method in which the soft reset operation and hard reset operation are combined, image retention and reset noise are avoidable. However, there is the possibility that linearity of output signals with respect to incident optical signals might be damaged.

Figures 5A, 5B:
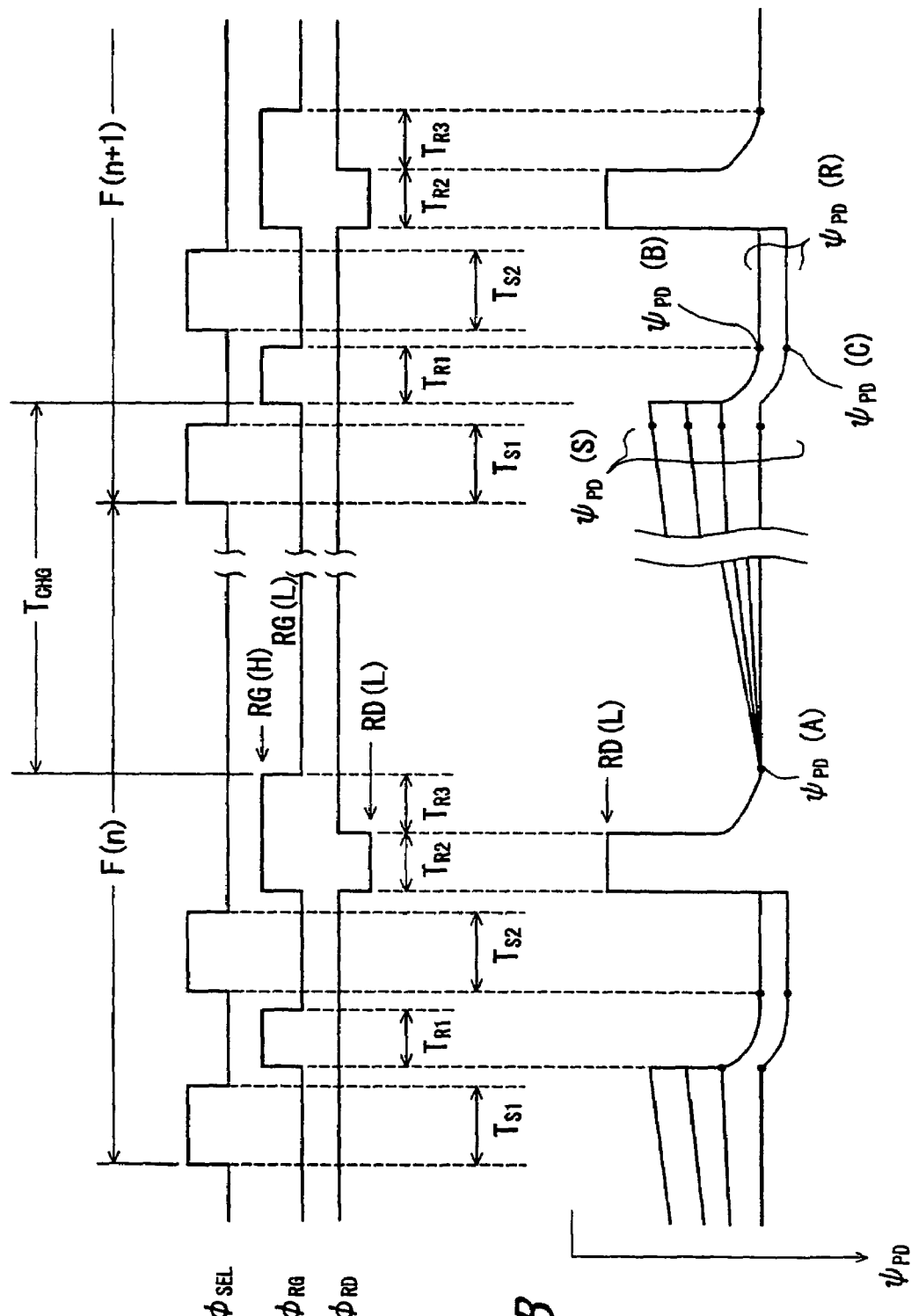
FIG. 5A is a view showing analyzed operation of the pixel.
FIG. 5B is a view showing analyzed change in potential $\psi_{PD}$ of a photodiode corresponding to the timing shown in FIG. 5A.
Figure 6:
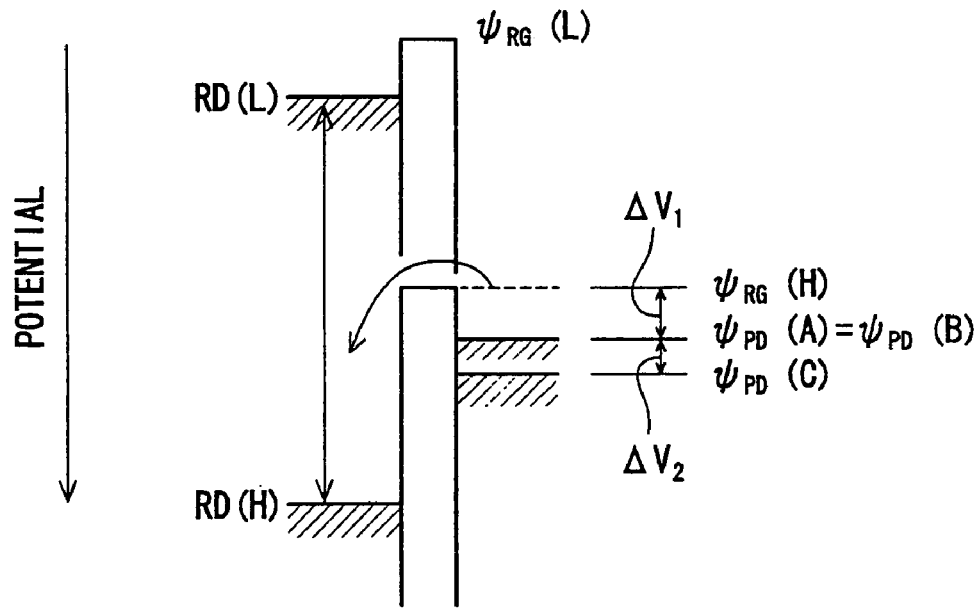
FIG. 6 is a view showing analyzed change in potential of the photodiode in the pixel.

As shown in FIG. 5A and FIG. 5B in details, due to a sub-threshold current during the third reset period $T_{R3}$, the photodiode potential $\psi_{PD}$ (A) immediately after the period $T_{R3}$ in the preceding frame F(n) becomes lower by $\Delta V1$ (see FIG. 6) than the channel potential $\psi_{RG}$ (H) obtained by the reset gate potential RG (H). The photodiode potential immediately before the first reset period $T_{R1}$ in the noticed frame F(n+1) drops due to the charges generated by an incident optical signal during optical signal storage period $T_{CHG}$ after the third reset period $T_{R3}$ in the preceding frame F(n). If the potential drop amount is not less than $\Delta V1$, then the photodiode potential immediately after the first reset period $T_{R1}$ in the noticed frame becomes $\psi_{PD}$ (B) that is equal to $\psi_{PD}$ (A).

However, if the potential drop amount during optical signal storage period $T_{CHG}$ is 0 because of, for example, the absence of incident optical signals, then the photodiode potential immediately before the first reset period $T_{R1}$ in the noticed frame F(n+1) stays $\psi_{PD}$ (A). Due to the sub-threshold current generated during the first reset period $T_{R1}$ in the noticed frame F(n+1), the photodiode potential becomes $\psi PD$ (C) that is lower than the above stated $\psi_{PD}$ (A) by $\Delta V2$ (see FIG. 6). Moreover, if an incident light signal is small and so potential drop during the optical signal storage period $T_{CHG}$ is in the range from 0 to $\Delta V1$, then the photodiode potential immediately after the first reset period $T_{R1}$ in the noticed frame F(n+1) becomes a value between $\psi_{PD}$ (B) and $\psi_{VPD}$ (C)

Figure 7:
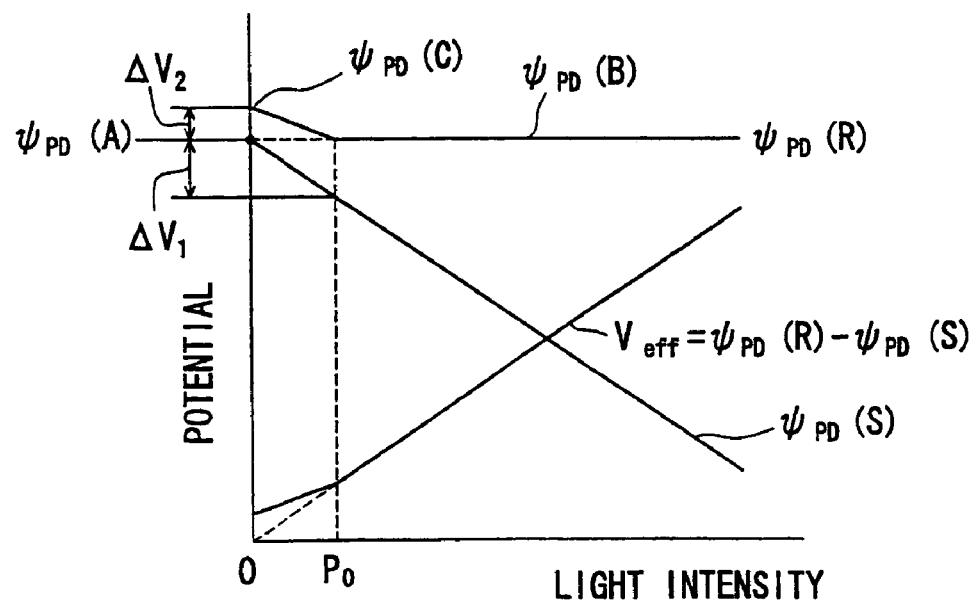
FIG. 7 is a view showing the response of the pixel against incident light.

FIG. 7 shows change in photodiode potential immediately after the first reset period $T_{R1}$ in the noticed frame when incident light intensity is varied. It is to be noted that the photodiode potential immediately before the first reset period $T_{R1}$ in the noticed frame is expressed by $\psi_{PD}$ (S) as a readout signal level. Also the photodiode potential immediately after the first reset period $T_{R1}$ in the noticed frame is expressed by $\psi_{PD}$ (R) as a reset level. In this case, a pixel output signal Veff is expressed in the following equation (5):

$$Veff = \psi_{PD}(R) - \psi_{PD}(S) \quad (5)$$

As shown in FIG. 7, with $\psi_{PD}$ (A) as an initial value, $\psi_{PD}$ (S) linearly decreases in proportion to the increase in incident light intensity. If the incident light intensity is not less than $P_0$ with which $\psi_{PD}$ (S) changes from $\psi_{PD}$ (A) by an amount of not less than $\Delta V1$, then $\psi_{PD}$ (R) becomes a constant value $\psi_{PD}$ (B). However, if the incident light intensity is not more than $P_0$, then $\psi_{PD}$ (R) increases as the incident light intensity decreases and becomes $\psi_{PD}$ (C), that is larger by $\Delta V2$ than $\psi_{PD}$ (A), when the incident light intensity reaches 0. Therefore, the pixel output signal Veff is linearly changed with respect to the incident light intensity if the incident light intensity is not less than $P_0$, whereas the pixel output signal Veff is not linearly changed with respect to the incident light intensity if the incident light intensity is not more than $P_0$. More precisely, when the incident light intensity is low (when the incident light intensity is in the range from 0 to $P_0$), output signals cannot maintain linearity against incident optical signals.

Accordingly, in the following embodiment, description will be given of an amplification-type solid-state image pickup device capable of reducing both reset noise and image retention with a simple constitution as well as retaining linearity of output signals against incident optical signals.

Figure 8:
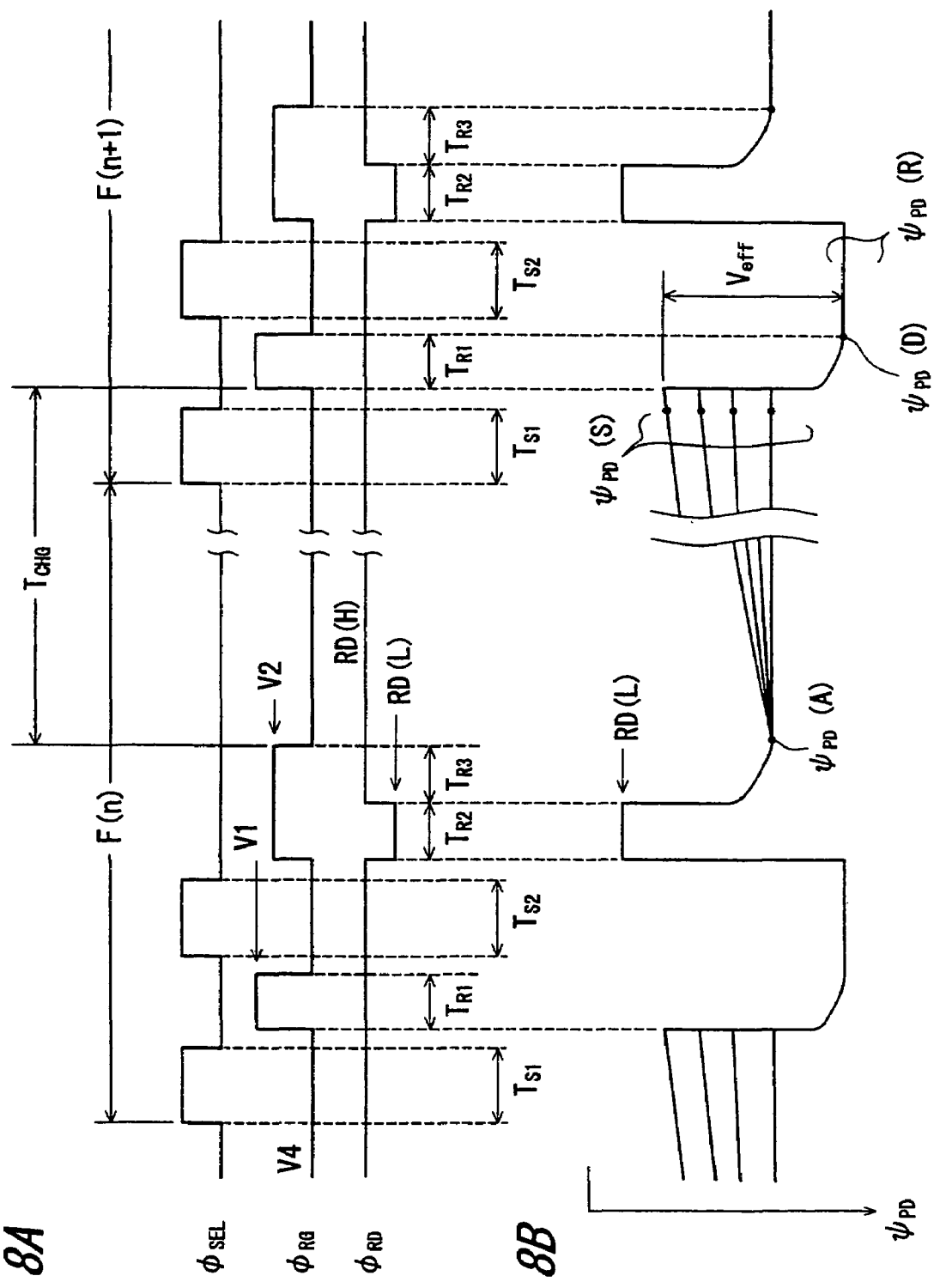
FIG. 8A is a view showing operation timing of a given pixel in an APS-type image sensor in one embodiment of the present invention.
FIG. 8B is a view showing potential $\psi_{PD}$ of a photodiode corresponding to the timing shown in FIG. 8A.

This embodiment is different from the previous embodiment in the point that three pulsed driving voltages $\phi_{RG}$, which take three values of V1, V2 and V4 (shown in FIG. 8) as described later, are applied to the gates of the MOS transistors for reset 2 through the reset gate lines 8. Other points are the same as the previous embodiment.

Figure 12:
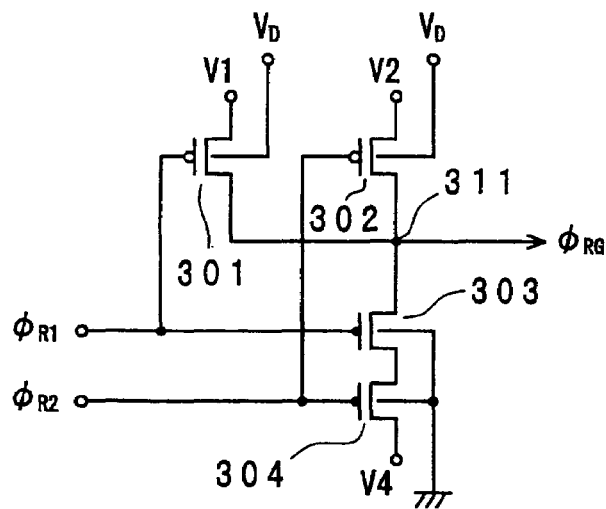
FIG. 12 is a view exemplifying a circuit for producing reset gate potential $\phi_{RG}$ for the pixel.

FIG. 12 shows the constitution of a reset gate voltage generation circuit serving as a voltage setting portion for generating the driving voltages $\phi_{RG}$. The reset gate voltage generation circuit is composed of P channel-type MOS transistors 301, 302 and an N channel-type MOS transistor 303, one terminals of which are each connected to a node 311, and an N channel-type MOS transistor 304 connected in series to the transistor 303. The other terminals of the P channel-type MOS transistors 301, 302 are respectively connected to voltage supplies V1 and V2. The other terminal of the N channel-type MOS transistor 304 is connected to a voltage supply V4. The back gates of the P channel-type MOS transistors 301, 302 are each connected to a voltage supply $V_D$, while the back gates of the N channel-type MOS transistors 303, 304 are each connected to the ground (0 potential). The relation of the voltages V1, V2, V4 and $V_D$ supplied by each supply voltage is $V_D > V1 > V2 > V4 > 0$.

Control pulse signals $\phi_{R1}$ taking the above stated two values, $V_D$ and 0, are applied to the gates of the P channel-type MOS transistor 301 and the N channel-type MOS transistor 303, while control pulse signals $\phi_{R2}$ taking the above stated two values, $V_D$ and 0, are applied to the gates of the P channel-type MOS transistor 302 and the N channel-type MOS transistor 303.

Figure 13:
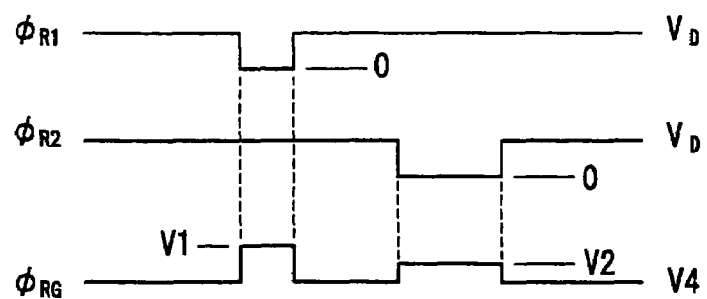
FIG. 13 is a view showing operation timing of the circuit shown in FIG. 12.
Figure 14:
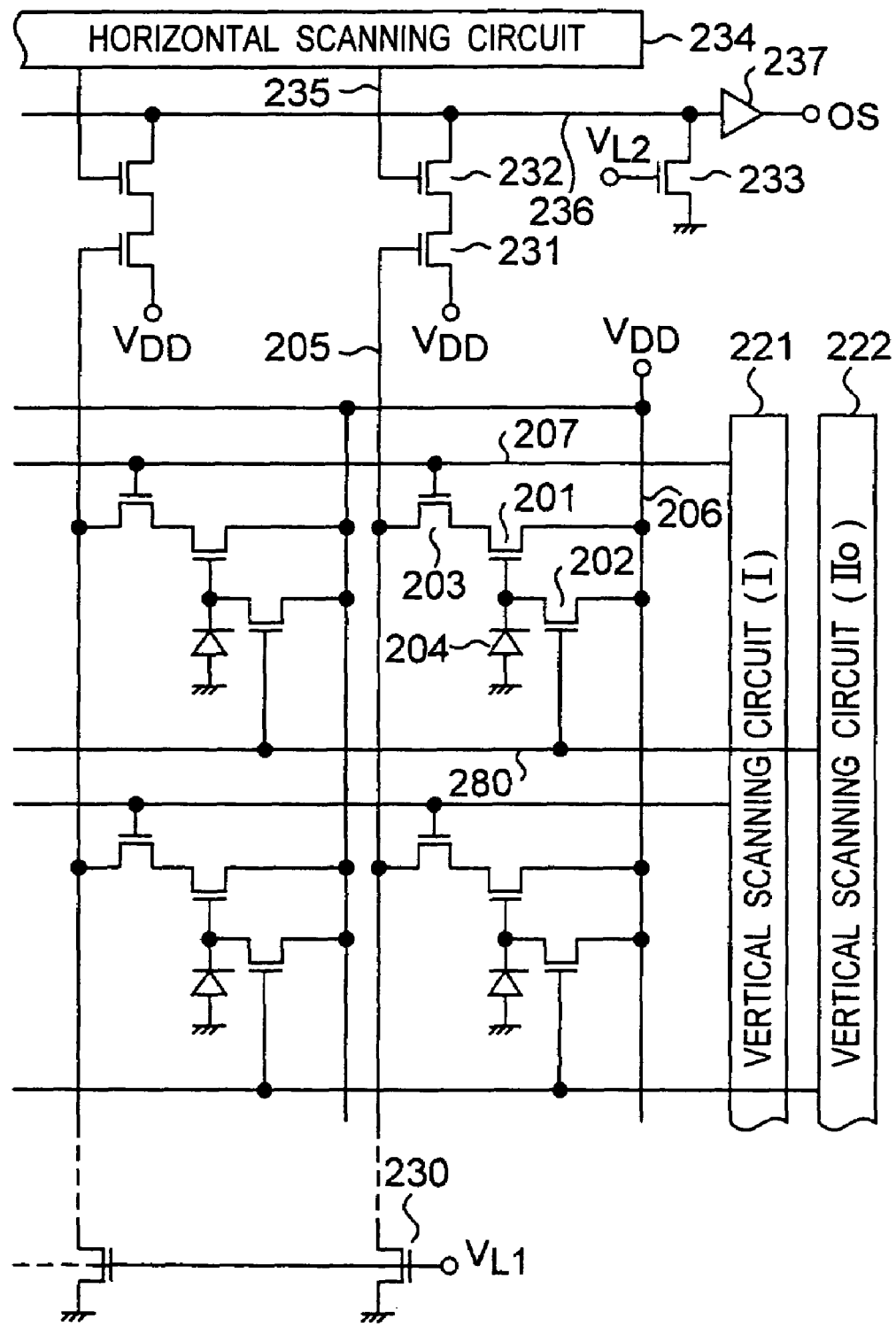
FIG. 14 is a view showing the circuit constitution of a conventional APS-type image sensor including four pixels.
Figure 15:
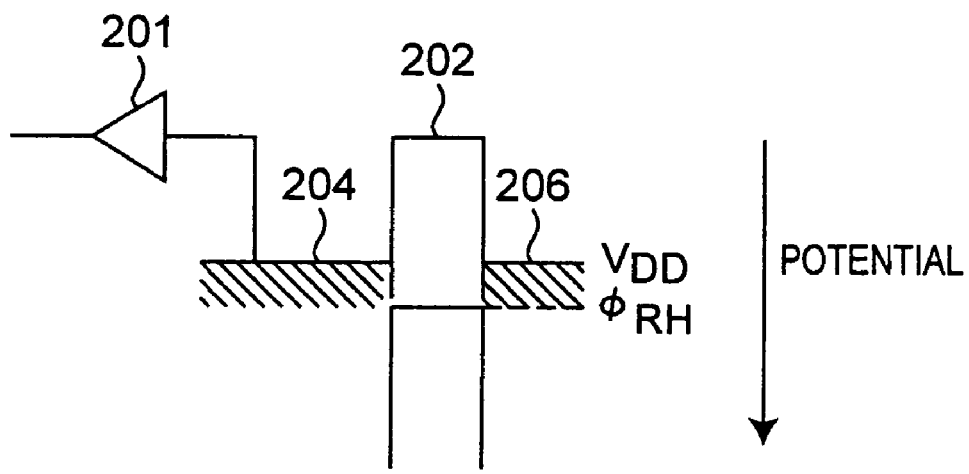
FIG. 15 is a view showing a potential gained by a hard reset operation of the pixel in the image sensor.
Figure 16:
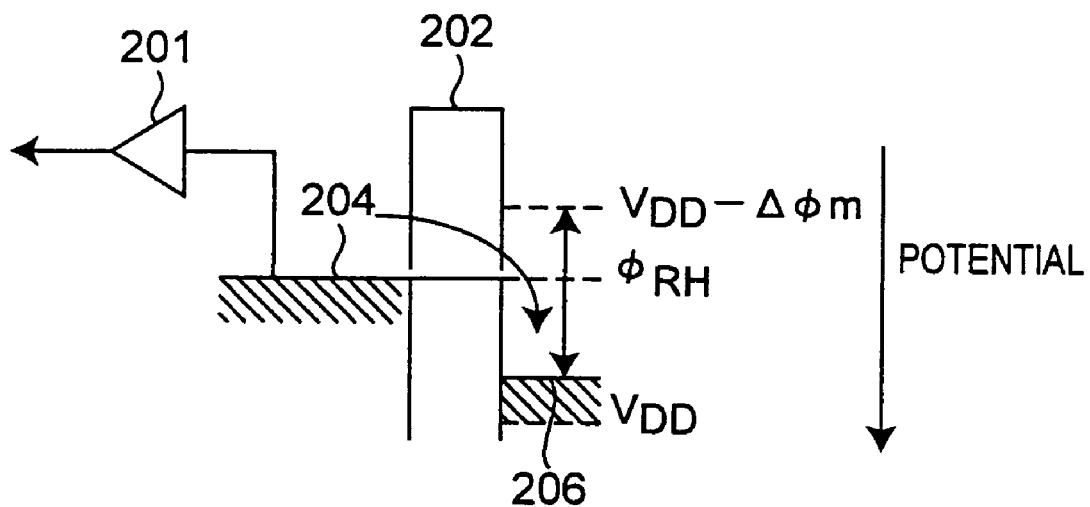
FIG. 16 is a view showing a potential gained by a soft reset operation of the pixel in the image sensor.
Figure 17:
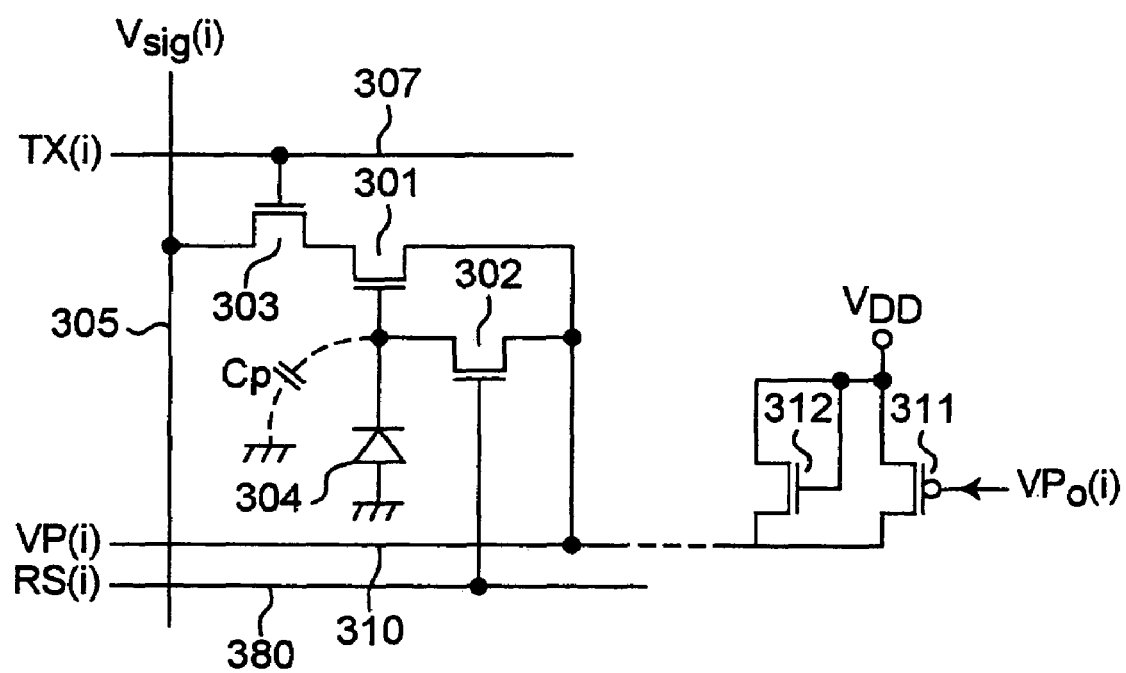
FIG. 17 is a view showing a modified example of the circuit constitution of a conventional APS-type image sensor.
Figure 18:
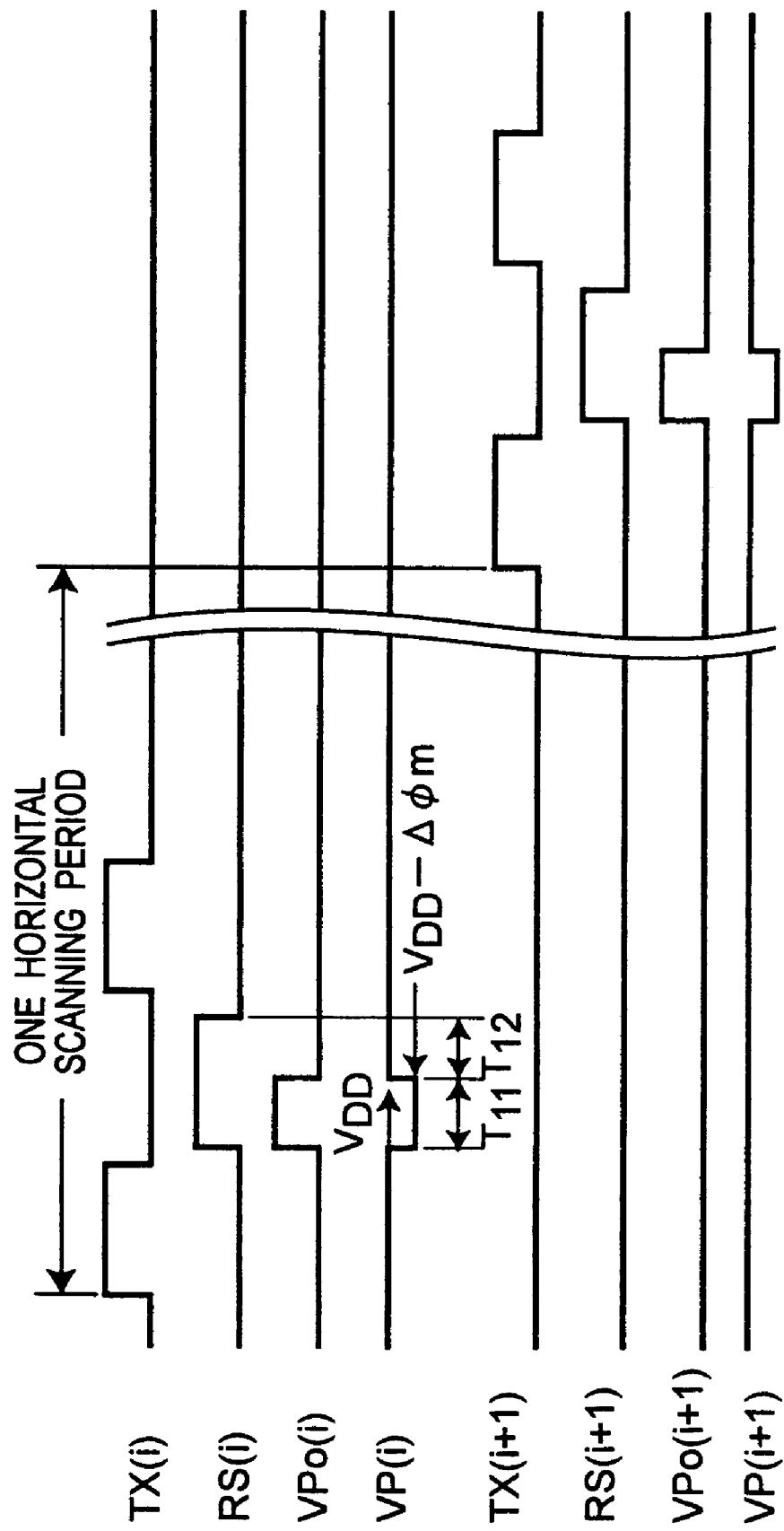
FIG. 18 is a view showing operation timing of the image sensor.

The CPU 90 shown in FIG. 1A sequentially applies the control pulse signals $\phi_{R1}$ and $\phi_{R2}$ in conformity to the timing shown in FIG. 13, by which pulsed driving voltages $\phi_{RG}$ taking tree voltage values, V1, V2 and V4, are outputted from the node 311.

FIG. 8A shows operation timing of a given pixel by the control of the CPU 90. Herein, $\phi_{SEL}$ represents a signal applied to the pixel selection line 7, $\phi_{RG}$ represents a signal applied to the reset gate line 8, and $\phi_{RD}$ represents a signal applied to the drain line 6. FIG. 8B shows change in potential $\psi_{PD}$ of the photodiode 4 in conformity to the timing shown in FIG. 8A. A period for scanning one screen is expressed as a frame F. It is to be noted that as with the previous embodiment, reference numeral (n), (n+1), . . . represent frame numbers, and a preceding frame is referred to as F(n) and a succeeding noticed frame as F (n+1).

The two-dimensional image sensor repeats, in every frame F, a signal level readout period $T_{S1}$, a first reset period $T_{R1}$, a reset level readout period $T_{S2}$, a second reset period $T_{R2}$, and a third reset period $T_{R3}$ in this order. In the first reset period $T_{R1}$ and the third reset period $T_{R3}$, the MOS transistor for reset 2 is set to execute a soft reset operation, while in the second reset period $T_{R2}$, the MOS transistor for reset 2 is set to execute a hard reset operation. Moreover, values of the reset gate potential $\phi_{RG}$ are V1 in the first reset period $T_{R1}$, V2 in the second and third reset period $T_{S2}$, and V4 in other period $T_{R3}$.

Hereinbelow, description will be given focusing on the frame F(n+1).

i) First, in the signal level readout period $T_{S1}$, a signal $\phi_{SEL}$ becomes high and the MOS transistor for pixel selection 3 is turned on. As a consequence, a potential level of the photodiode 4 is read out as a signal Vout to the signal line 5 through the MOS transistor for signal amplification 1 and the MOS transistor for pixel selection 3.

Figure 9:
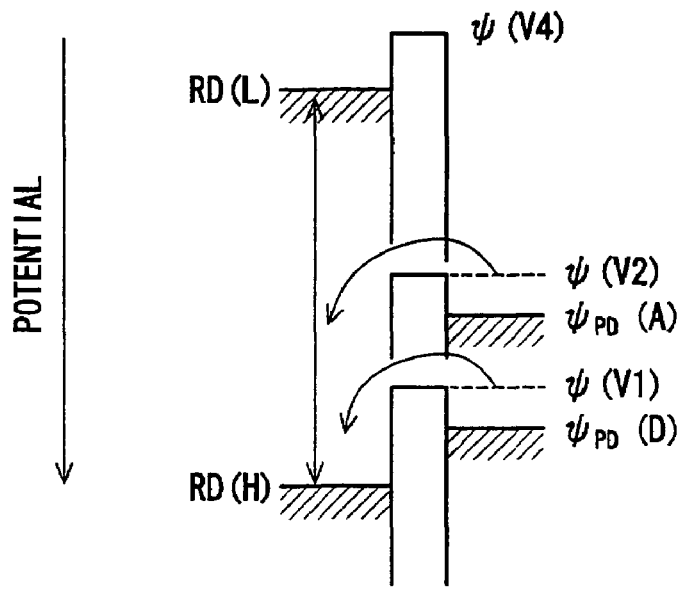
FIG. 9 is a schematic view showing change in potential of the photodiode in the pixel.

Herein, the reset operation executed at the end in the preceding frame F(n) is a soft reset operation in the third reset period $T_{R3}$. (reset gate potential $\phi_{RG}$=V2). Since the soft reset operation is executed in succession to the hard reset operation, the potential $\psi_{PD}$ (A) of the photodiode 4 reached by the soft reset operation always stays constant regardless of the intensity of incident light (see the potential diagram in FIG. 9).

After lapse of an optical signal storage period $T_{CHG}$ for storing charges in the photodiode 4 in succession to the third reset period $T_{R3}$ in the preceding frame F(n), a potential level $\psi_{PD}$ (S) obtained by the charges stored in the photodiode 4 is read out in the signal level readout period $T_{S1}$ in the noticed frame F(n+1) (the signal read out at this point is referred to as a "readout signal level").

ii) Next, in the first reset period $T_{R1}$, the signal $\phi_{SEL}$ becomes low and the MOS transistor for pixel selection 3 is turned off. Then, the MOS transistor for reset 2 is set to execute a soft reset operation with a sub-threshold current (reset gate potential $\phi_{RG}$=V1).

With the relation of $V1 \geq V2$, the potential $\psi_{PD}$ (D) of the photodiode 4 reached by the soft reset operation stays constant regardless of the intensity of incident light (i.e., a charge amount stored in photodiode 4 during the optical signal storage period $T_{CHG}$) as with the case of executing the soft reset operation in succession to the hard reset operation.

It is to be noted that in order to ensure the independency of the photodiode potential $\psi_{PD}$ (D) from the incident light intensity, a value of |V1−V2| should preferably be set larger than a difference ΔV1 between a channel potential ψ (V2) in the third reset period $T_{R3}$ (when reset gate potential $φ_{RG}$=V2) and a potential $ψ_{PD}$ (A) reached by the photodiode 4.

iii) Next, in the reset level readout period $T_{S2}$, the signal $φ_{SEL}$ becomes high and the MOS transistor for pixel selection 3 is turned on. As a consequence, a potential level $ψ_{PD}$ (R) of the photodiode 4 is read out to the signal line 5 through the MOS transistor for signal amplification 1 and the MOS transistor for pixel selection 3. The signal $ψ_{PD}$ (R) read out at this point is referred to as a "readout reset level".

Herein, in the soft reset operation, due to memory effect, a correlation is developed between reset noise after the last soft reset operation in the preceding frame F(n) and reset noise after the first soft reset operation in the noticed frame F(n+1). Accordingly, if Correlated Double Sampling (CDS) operation is performed to obtain a difference Veff (this is called a "pixel output signal) between the readout signal level $ψ_{PD}$ (S) and the readout reset level $ψ_{PD}$ (R), the reset noise is drastically reduced. It is to be noted that in this case, the pixel output signal Veff is expressed in the following equation:

$$Veff = φ_{PD}(R) - ψ_{PD}(S)$$

Figure 10:
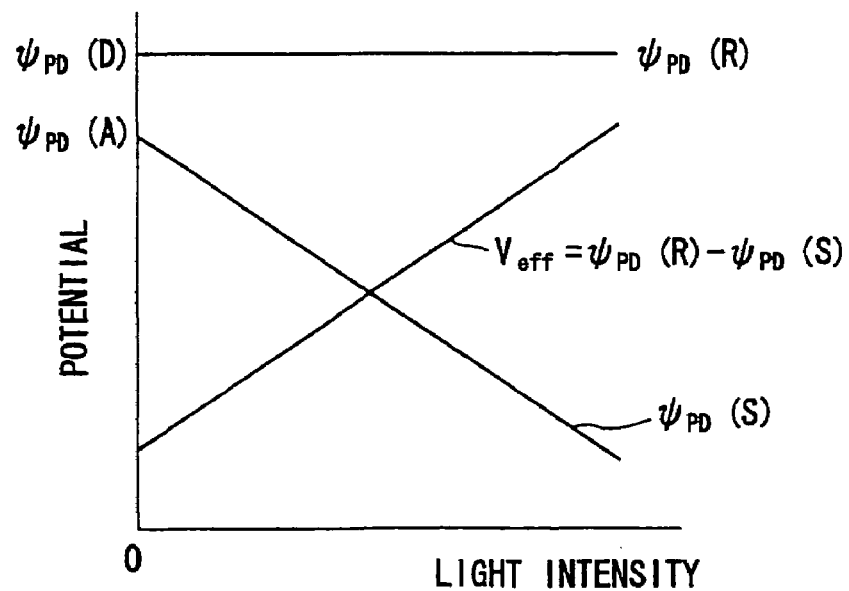
FIG. 10 is a view showing the response of the pixel against incident light.

Furthermore, as described before, both the potential of the photodiode 4 reached by the soft reset operation in the third reset period $T_{R3}$ in the preceding frame F(n) and the potential (readout reset level) of the photodiode 4 reached by the soft reset operation in the first reset period $T_{R1}$ in the noticed frame stay constant regardless of the intensity of incident light (i.e., a charge amount stored in the photodiode 4 during the optical signal storage period $T_{CHG}$). Therefore, as shown in FIG. 10, a pixel output signal Veff expressed by a difference between the readout signal level $ψ_{PD}$ (S) and the readout reset level $ψ_{PD}$ (R) can be linearly changed with respect to the intensity of incident light.

iv) Next, in the second reset period $T_{R2}$, the signal $φ_{SEL}$ becomes low and the MOS transistor for pixel selection 3 is turned off. Then, the MOS transistor for reset 2 is set to execute a hard reset operation so as to fix the potential of the photodiode 4 to a drain potential. Since the potential in the photodiode 4 is fixed to a drain potential, the problem of the image retention can be solved in this stage.

v) After that, in the third reset period $T_{R3}$, the MOS transistor for reset 2 is set to execute a soft reset operation with a sub-threshold current (reset gate potential $φ_{RG}$=V2). The charges stored in the photodiode 4 after execution of the soft rest operation is further read out in the frame immediately after the frame F(n+1).

In such a case, the problem of the image retention has already been solved in the second reset period $T_{R2}$, and therefore image retention is confined to one frame. Therefore, the image retention is decreased and becomes substantially negligible.

Further, such control as repeating, in every frame F, the signal level readout period $T_{S1}$, the first reset period $T_{R1}$, the reset level readout period $T_{S2}$, the second reset period $T_{R2}$, and the third reset period $T_{R3}$ in this order can be easily implemented by the CPU 90. Therefore, the two-dimensional image sensor is easily constituted without the necessity of using specific component parts or the like.

Although in the above example, the drains of the MOS transistors for amplification 1 and the drains of the MOS transistors for reset 2 are each connected on a column basis to a shared drain line 6, the present invention is not limited thereto and therefore individual lines may be provided as shown in FIG. 1B. In the example of FIG. 1B, the drains of the MOS transistors for reset 2 are each connected on a row basis to reset drain lines 61 extending in row direction. Two pulsed driving voltages $φ_{RD}$ are sequentially applied to the drains of the MOS transistors for reset 2 on a row basis through the reset drain lines 61 by an unshown third scanning circuit. This enables drain potentials of the MOS transistors for reset 2 to be controlled on a row basis. The drains of the MOS transistors for amplification 1 are each connected on a column basis to a drain line 62 extending in column direction. A DC voltage $V_D$ is applied to the drain of the MOS transistor for amplification 1 through the drain line 62. The circuit of FIG. 1B operates similarly to the circuit described with reference to FIGS. 8A, 8B, 9 and 10 except that the drain voltage of the MOS transistor for amplification 1 is fixed to $V_D$.

Further, it should naturally be understood that field effect transistors other than the N channel-type MOS transistor can also be used as the transistors 1, 2 and 3.

Figure 11:
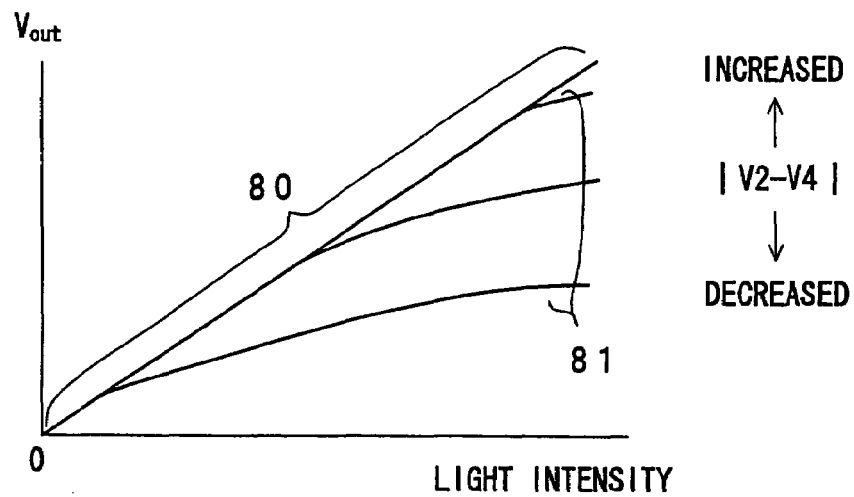
FIG. 11 is a view showing change in response of the pixel against incident light with varied reset gate potentials.

A difference |V2−V4| between V2 and V4, the values taken by the reset gate potential $φ_{RG}$ shown in FIG. 8A, can be set arbitrarily. If the value of |V2−V4| is sufficiently large, then signal charges that are photon-electron converted during the optical signal storage period $T_{CHG}$ are linearly stored in the photodiode 4. More precisely, the amplification-type solid-state image pickup device exhibits a linear photon-electron conversion characteristic substantially in the entire region of the incident light intensity as shown by a reference numeral 80 in FIG. 11. If the value of |V2−V4| is dropped and falls within a certain range, then a sub-threshold operation is taken place in a region high in the intensity of incident light as shown by a reference numeral 81 in FIG. 11, and the potential of the photodiode 4 is logarithmically changed with respect to the intensity of incident light. More precisely, the amplification-type solid-state image pickup device is characterized by exhibiting both the linear photon-electron conversion characteristic substantially and logarithmic photon-electron conversion characteristic. If the value of |V2−V4| is sufficiently small, then a sub-threshold operation is taken place substantially in the entire region of the incident light intensity and the potential of the photodiode 4 is logarithmically changed with respect to the intensity of incident light. More precisely, the amplification-type solid-state image pickup device exhibits the logarithmic photon-electron conversion characteristic substantially in the entire region of the incident light intensity. Thus, if the value of |V2−V4| is set within a certain range, a sub-threshold operation is taken place in a region high in the intensity of incident light and the logarithmic photon-electron conversion characteristic is exhibited, whereas in the region low in the intensity of incident light, the linear photon-electron conversion characteristic is exhibited. This allows application of the amplification-type solid-state image pickup device either to logarithmic conversion-type image sensors and linear conversion-type image sensors.

It is to be understood that different reset gate potential $φ_{RG}$ may be allotted to the second reset period $T_{R2}$ and the third reset period $T_{R3}$, and in such a case, the reset gate potential $φ_{RG}$ in the third reset period $T_{R3}$ may be set at V3 (provided that V3≠V2). In this case, the effects of the present invention can be achieved if the following two equations are satisfied:

$$|V1-Vt| \geq |V2-Vt| \geq |V4-Vt|$$

$$|V1-Vt| \geq |V3-Vt| \geq |V4|Vt|$$

This makes it possible to reduce both reset noise and image retention with a simple constitution as well as retaining linearity of output signals against incident optical signals. If the same reset gate potential $\phi_{RG}$ (V3=V2) is allotted to the second reset period $T_{R2}$ and the third reset period $T_{R3}$ like the above-stated embodiment, then a circuit for generating the reset gate potential $\phi_{RG}$ can be simplified.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An amplification-type solid-state image pickup device, comprising:

a plurality of arrayed pixels, each of the pixels being composed of at least a photon-electron conversion region, a field effect transistor for signal amplification for amplifying signals expressed by potentials of the photon-electron conversion region, a field effect transistor for reset for discharging charges in the photon-electron conversion region to a drain, and a field effect transistor for pixel selection; and a control portion for executing control so that with respect to each frame in each of the pixels, there are repeated in the following order a signal level readout period in which a potential level of the photon-electron conversion region is read through the field effect transistor for signal amplification, a first reset period in which the field effect transistor for reset executes a soft reset operation with a sub-threshold current, a reset level readout period in which a potential level of the photon-electron conversion region reached by the soft reset operation in the first reset period is read through the field effect transistor for signal amplification, a second reset period in which the field effect transistor for reset executes a hard reset operation so as to fix the potential of the photon-electron conversion region to a drain potential, and a third reset period in which the field effect transistor for reset executes a soft reset operation with a sub-threshold current.

2. The amplification-type solid-state image pickup device as defined in claim 1, further comprising a correlated double sampling portion for performing a correlated double sampling operation on between a signal read out in the signal level readout period and a signal read out in the reset level readout period.

3. The amplification-type solid-state image pickup device as defined in claim 1, wherein a plurality of the pixels are arrayed in matrix form, gates of the field effect transistors for reset are each connected on a row basis to reset gate lines extending in row direction, and there is provided a first scanning circuit for sequentially applying two pulsed driving voltages to the gates of the field effect transistors for reset on a row basis through the reset gate lines.

4. The amplification-type solid-state image pickup device as defined in claim 3, wherein one terminals of the field effect transistors for pixel selection are each connected on a column basis to signal lines extending in column direction, gates of the field effect transistors for pixel selection are each connected on a row basis to pixel selection lines extending in row direction, and there is provided a second scanning circuit for sequentially applying two pulsed driving voltages to the gates of the field effect transistors for pixel selection on a row basis through the pixel selection lines.

5. The amplification-type solid-state image pickup device as defined in claim 3, wherein drains of the field effect transistors for reset are each connected on a column basis to drain lines extending in column direction, and there is provided a voltage application portion for applying two pulsed driving voltages to the drains of the field effect transistors for reset through the drain lines.

6. The amplification-type solid-state image pickup device as defined in claim 5, wherein drains of the field effect transistors for amplification are each connected on a column basis to the drain lines.

7. The amplification-type solid-state image pickup device as defined in claim 3, wherein drains of the field effect transistors for reset are each connected on a row basis to reset drain lines extending in row direction, and there is provided a third scanning circuit for sequentially applying two pulsed driving voltages to the drains of the field effect transistors for reset on a row basis through the reset drain lines.

8. The amplification-type solid-state image pickup device as defined in claim 1, further comprising a voltage setting portion for setting voltages V1, V2 and V4 so as to satisfy a relation $$|V1-Vt| \geq |V2-Vt| \geq |V4-Vt|$$

wherein V1 denotes a gate voltage of the field effect transistor for reset in the first reset period, V2 denotes a gate voltage of the field effect transistor for reset in the second reset period and the third reset period, V4 denotes a gate voltage of the field effect transistor for reset in periods other than the first and second reset periods, and Vt denotes a threshold gate voltage of the field effect transistor for reset.

9. The amplification-type solid-state image pickup device as defined in claim 8, wherein the voltage setting portion sets a value of |V1−V2| to be larger than a specified value so that a potential of the photon-electron conversion region immediately after the first reset period stays constant regardless of intensity of incident light to the photon-electron conversion region.

10. The amplification-type solid-state image pickup device as defined in claim 8, wherein the voltage setting portion sets a value of |V2−V4| within a specified range so that potential change of the photon-electron conversion region with respect to intensity of incident light is linear if the intensity of incident light is low whereas the potential change is logarithmic if the intensity of incident light is high.

11. The amplification-type solid-state image pickup device as defined in claim 8, further comprising a correlated double sampling portion for performing a correlated double sampling operation on between a signal read out in the signal level readout period and a signal read out in the reset level readout period.

12. The amplification-type solid-state image pickup device as defined in claim 8, wherein
- a plurality of the pixels are arrayed in matrix form,
- gates of the field effect transistors for reset are each connected on a row basis to reset gate lines extending in row direction, and
- the voltage setting portion includes a first scanning circuit for sequentially applying three pulsed driving voltages that are said V1, V2 and V4 to the gates of the field effect transistors for reset on a row basis through the reset gate lines.

13. The amplification-type solid-state image pickup device as defined in claim 12, wherein
- one terminals of the field effect transistors for pixel selection are each connected on a column basis to signal lines extending in column direction,
- gates of the field effect transistors for pixel selection are each connected on a row basis to pixel selection lines extending in row direction, and
- there is provided a second scanning circuit for sequentially applying two pulsed driving voltages to the gates of the field effect transistors for pixel selection on a row basis through the pixel selection lines.

14. The amplification-type solid-state image pickup device as defined in claim 12, wherein
- drains of the field effect transistors for reset are each connected on a column basis to drain lines extending in column direction, and
- there is provided a voltage application portion for applying two pulsed driving voltages to the drains of the field effect transistors for reset through the drain lines.

15. The amplification-type solid-state image pickup device as defined in claim 14, wherein
- drains of the field effect transistors for amplification are each connected on a column basis to the drain lines.

16. The amplification-type solid-state image pickup device as defined in claim 12, wherein
- drains of the field effect transistors for reset are each connected on a row basis to reset drain lines extending in row direction, and
- there is provided a third scanning circuit for sequentially applying two pulsed driving voltages to the drains of the field effect transistors for reset on a row basis through the reset drain lines.

* * * * *